(12) United States Patent
Tamura et al.

(10) Patent No.: US 9,276,066 B2
(45) Date of Patent: Mar. 1, 2016

(54) SEMICONDUCTOR MULTI-LAYER SUBSTRATE AND SEMICONDUCTOR ELEMENT

(71) Applicant: FUJI ELECTRIC CO., LTD., Kawasaki-shi, Kanagawa (JP)

(72) Inventors: Ryosuke Tamura, Tokyo (JP); Kazuyuki Umeno, Tokyo (JP); Tatsuyuki Shinagawa, Tokyo (JP); Keishi Takaki, Tokyo (JP); Ryohei Makino, Tokyo (JP); Jiang Li, Tokyo (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/422,398

(22) PCT Filed: Jul. 5, 2013

(86) PCT No.: PCT/JP2013/068560
§ 371 (c)(1),
(2) Date: Feb. 19, 2015

(87) PCT Pub. No.: WO2014/050250
PCT Pub. Date: Apr. 3, 2014

(65) Prior Publication Data
US 2015/0221725 A1    Aug. 6, 2015

(30) Foreign Application Priority Data

Sep. 25, 2012 (JP) ................................. 2012-210914

(51) Int. Cl.
*H01L 29/00* (2006.01)
*H01L 29/10* (2006.01)
(Continued)

(52) U.S. Cl.
CPC ........ *H01L 29/1075* (2013.01); *H01L 21/0254* (2013.01); *H01L 21/02458* (2013.01);
(Continued)

(58) Field of Classification Search
CPC .............. H01L 29/1075; H01L 29/205; H01L 29/2003; H01L 29/778; H01L 29/7786; H01L 29/872; H01L 29/402; H01L 29/51; H01L 21/02458; H01L 21/02505; H01L 21/0254; H01L 29/207
See application file for complete search history.

(56) References Cited

U.S. PATENT DOCUMENTS 6,849,882 B2 *  2/2005  Chavarkar et al. ............ 257/191
7,544,963 B2 *  6/2009  Saxler ............................. 257/20
(Continued)

FOREIGN PATENT DOCUMENTS

| JP | 2003-059948 A | 2/2003 |
| JP | 2008-159621 A | 7/2008 |
| JP | 2008-171843 A | 7/2008 |
| JP | 2012-151422 A | 8/2012 |

OTHER PUBLICATIONS

PCT, "International Search Report for International Application No. PCT/JP2013/068560"

*Primary Examiner* — Nikolay Yushin
(74) *Attorney, Agent, or Firm* — Manabu Kanesaka

(57) ABSTRACT

A semiconductor multi-layer substrate includes a substrate, a buffer layer formed on the substrate and made of a nitride semiconductor, an electric-field control layer formed on the buffer layer and made of a nitride semiconductor, the electric-field control layer having conductivity in the substrate's lateral direction, an electric-field relaxation layer formed on the electric-field control layer and made of a nitride semiconductor, and an active layer formed on the electric-field relaxation layer and made of an nitride semiconductor. A resistance in the substrate's lateral direction of the electric-field control layer is equal to or smaller than 10 times a resistance of the electric-field relaxation layer, and a ratio of an electric field share between the electric-field relaxation layer and the buffer layer is controlled by a ratio between a thickness of the electric-field relaxation layer and a thickness of the buffer layer.

26 Claims, 13 Drawing Sheets

(51) Int. Cl.
    *H01L 29/778* (2006.01)
    *H01L 29/872* (2006.01)
    *H01L 21/02* (2006.01)
    H01L 29/40 (2006.01)
    H01L 29/20 (2006.01)
    H01L 29/51 (2006.01)
    H01L 29/205 (2006.01)
    H01L 29/207 (2006.01)

(52) U.S. Cl.
    CPC ........ *H01L21/02505* (2013.01); *H01L 29/778* (2013.01); *H01L 29/7786* (2013.01); *H01L 29/872* (2013.01); *H01L 29/2003* (2013.01); *H01L 29/205* (2013.01); *H01L 29/207* (2013.01); *H01L 29/402* (2013.01); *H01L 29/51* (2013.01)

(56) References Cited

U.S. PATENT DOCUMENTS

| | | | |
|---|---|---|---|
| 8,410,525 B2* | 4/2013 | Sato | 257/194 |
| 8,487,346 B2 | 7/2013 | Sato | |
| 2002/0167023 A1* | 11/2002 | Chavarkar et al. | 257/194 |
| 2010/0123169 A1* | 5/2010 | Sato | 257/183 |
| 2012/0217507 A1* | 8/2012 | Ohki | 257/76 |

* cited by examiner

DISTANCE BETWEEN UPPER SURFACE OF ELECTRIC-FIELD
RELAXATION LAYER AND UPPER SURFACE OF ELECTRIC-FIELD
CONTROL LAYER/(ELECTRIC-FIELD RELAXATION
LAYER+ELECTRIC-FIELD CONTROL LAYER+BUFFER LAYER)

SEMICONDUCTOR MULTI-LAYER SUBSTRATE AND SEMICONDUCTOR ELEMENT

RELATED APPLICATIONS

The present application is National Phase of International Application No. PCT/JP2013/068560 filed Jul. 5, 2013, and claims priority from Japanese Application No. 2012-210914, filed Sep. 25, 2012, the disclosure of which is hereby incorporated by reference herein in its entirety.

FIELD

The present invention relates to a semiconductor multi-layer substrate and a semiconductor element.

A group-III nitride semiconductor (hereafter nitride semiconductor) such as GaN and the like gathers attention, as a material for a next generation's power semiconductor element since it has a dielectric breakdown strength higher than that of a silicon semiconductor. Since it is difficult to produce a single-crystal substrate having a large aperture from the nitride semiconductor, it is common that the nitride semiconductor is grown on a substrate using a material that is different from the nitride semiconductor, for example, a silicon substrate or a sapphire substrate. In this case, in order to alleviate a thermal expansion coefficient difference and a lattice constant difference between the substrate and the nitride semiconductor, forming a buffer layer on the substrate allows an epitaxial growth of the nitride semiconductor on a substrate of a different kind preferably (see Patent Literatures 1 and 2).

CITATION LIST

Patent Literatures

Patent Literature 1: Japanese Laid-open Patent Publication No. 2003-59948
Patent Literature 2: Japanese Laid-open Patent Publication No. 2008-159621

SUMMARY

Technical Problem

A buffer layer disclosed in Patent Literature 1 has a structure in which a multi-layer structure of, for example, a first layer made of AlN having a thickness of 0.5 to 50 nm and a second layer made of GaN having a thickness of 0.5 to 200 nm, is repeated. However, a leakage current passing in a direction perpendicular to a substrate (direction perpendicular to a main surface of the substrate, i.e., in which a nitride semiconductor layer is layered) tends to increase in such a configuration of the buffer layer, the nitride semiconductor layer must be subjected to crystal growth of a sufficient thickness to obtain necessary withstand voltage. Since crystal growth time for the nitride semiconductor layer takes too long in this case, there was a problem of worsened throughput or an increase in necessary material gas, thus a production cost increased.

On the other hand, a buffer layer disclosed in Patent Literature 2 is configured by a first layer made of GaN having a 200 nm to 1000 nm of thickness and a second layer made of AlN having a 0.5 nm to 200 nm of thickness. A research conducted so far by the inventors of the present invention revealed that, in this configuration, a two-dimensional electron gas is produced at an interface of the AlN layer with the GaN layer at the top-most portion of the buffer layer. Herein since the two-dimensional electron gas has conductivity in a substrate's lateral direction (a direction that is parallel with the main surface of the substrate, i.e., a direction of a layer surface of the nitride semiconductor layer) causes leaking. Since the two-dimensional electron gas acts as an equipotential plane electrically, an electric field distribution is formed in which an electric field is concentrated on the nitride semiconductor layer (for example, GaN layer) above the buffer layer. As a result, leaking tends to increase between electrodes in the lateral direction of the semiconductor element using the buffer layer disclosed in Patent Literature 2, and in the end, a total thickness, for ensuring the withstand voltage, of the nitride semiconductor layers increases and a problem occurs that is similar to that in a case of using the buffer layer disclosed in Patent Literature 1.

The present invention has been made in view of the above and an object of the present invention is to provide a semiconductor multi-layer substrate and a semiconductor element that are capable of reducing the total thickness of the nitride semiconductor layers relative to a necessary withstand voltage.

Solution to Problem

In order to solve the above problems and to attain the object, according to an aspect of the present invention, there is provided a semiconductor multi-layer substrate including a substrate, a buffer layer formed on the substrate and made of a nitride semiconductor, an electric-field control layer formed on the buffer layer and made of a nitride semiconductor, the electric-field control layer having conductivity in the substrate's lateral direction, an electric-field relaxation layer formed on the electric-field control layer and made of a nitride semiconductor, and an active layer formed on the electric-field relaxation layer and made of an nitride semiconductor. A resistance in the substrate's lateral direction of the electric-field control layer is equal to or smaller than 10 times a resistance of the electric-field relaxation layer, and a ratio of an electric field share between the electric-field relaxation layer and the buffer layer is controlled by a ratio between a thickness of the electric-field relaxation layer and a thickness of the buffer layer.

In the semiconductor multi-layer substrate, the electric-field relaxation layer may include a first field-relaxing layer and a second field-relaxing layer being formed on the first field-relaxing layer and having a layer structure different from a layer structure of the first field-relaxing layer.

In the semiconductor multi-layer substrate, a ratio of a distance between an upper surface of the electric-field relaxation layer and an upper surface of the electric-field control layer relative to a sum of the thicknesses of the buffer layer, the electric-field control layer, and the electric-field relaxation layer may be within a range of 0.3 to 0.8.

In the semiconductor multi-layer substrate, a ratio of a distance between an upper surface of the electric-field relaxation layer and an upper surface of the electric-field control layer relative to a sum of the thicknesses of the buffer layer, the electric-field control layer, and the electric-field relaxation layer may be within a range of 0.3 to 0.7.

In the semiconductor multi-layer substrate, a ratio of a distance between an upper surface of the electric-field relaxation layer and an upper surface of the electric-field control layer relative to the sum of the thicknesses of the buffer layer, the electric-field control layer, and the electric-field relaxation layer may be within a range of 0.4 to 0.7.

In the semiconductor multi-layer substrate, a relationship of $0.3 \leq a/(a+b) \leq 0.8$ may hold true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

In the semiconductor multi-layer substrate, a relationship of $0.3 \leq a/(a+b) \leq 0.7$ may hold true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

In the semiconductor multi-layer substrate, a relationship of $0.4 \leq a/(a+b) \leq 0.7$ may hold true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

In the semiconductor multi-layer substrate, a relationship of $0.3 \leq c/(c+d) \leq 0.8$ may hold true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ cm$^{-3}$ to $1 \times 10^{20}$ cm$^{-3}$.

In the semiconductor multi-layer substrate, a relationship of $0.3 \leq c/(c+d) \leq 0.7$ may hold true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ cm$^{-3}$ to $1 \times 10^{20}$ cm$^{-3}$.

In the semiconductor multi-layer substrate, a relationship of $0.4 \cdot c/(c+d) \leq 0.7$ may hold true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ cm$^{-3}$ to $1 \times 10^{20}$ cm$^{-3}$.

In the semiconductor multi-layer substrate, the resistance in the substrate's lateral direction of the electric-field control layer may be equal to or smaller than 10 times the resistance of the electric-field relaxation layer.

In the semiconductor multi-layer substrate, the electric-field control layer may have a multi-layer structure including a first layer made of $Al_xGa_{1-x}N$ ($0 \leq x < 1$) and a second layer having a band-gap wider than a band-gap of the first layer and being made of $Al_yGa_{1-y}N$ ($0 < y \leq 1$).

In the semiconductor multi-layer substrate, the electric-field control layer may have an area of which resistance is reduced by doping an impurity.

In the semiconductor multi-layer substrate, in the electric-field relaxation layer, the second electric-field relaxation layer may be configured by a single layer made of a single composition, and the first electric-field relaxation layer is configured by a multi-layer structure of a first portion of which composition is the same as a composition of the second electric-field relaxation layer and a second portion of which composition is different from the composition of the second electric-field relaxation layer in an order from a side closer to the substrate, and the second portion has a thickness so that a resistance in the substrate's lateral direction at a portion where the first portion is connected to the second portion is larger than $1/10$ of the resistance of the second electric-field relaxation layer.

In the semiconductor multi-layer substrate, in the electric-field relaxation layer, the second electric-field relaxation layer may be configured by a single layer made of a single composition, and the first electric-field relaxation layer has a structure in which each of $Al_zGa_{1-z}N$ ($0 \leq z < 1$) layers of which thickness is 5 nm to 20 nm and each of $Al_wGa_{1-w}N$ ($0 < w \leq 1$ and $z < w$) layers of which thickness is 5 nm to 20 nm are layered several times alternately and repeatedly.

In the semiconductor multi-layer substrate the first field-relaxing layer of the electric-field relaxation layer may be configured by AlGaN having a composition in which a band-gap decreases from the substrate side toward the active layer side.

In the semiconductor multi-layer substrate, in the electric-field relaxation layer, the first field-relaxing layer may be made of a plurality of AlGaN layers having different compositions in which band-gaps are narrowed from the substrate side toward the active layer side.

In the semiconductor multi-layer substrate, the buffer layer may have a structure in which each of $Al_uGa_{1-u}N$ ($0 \leq u < 1$) layers of which thickness is 0.1 μm to 0.8 μm and each of $AlvGa_{1-v}N$ ($0 < v \leq 1$ and $u < v$) layers of which thickness is 20 nm to 60 nm are layered several times alternately and repeatedly.

In the semiconductor multi-layer substrate, the active layer may have a multi-layer structure of an electron transit layer and an electron supply layer being formed on the electron transit layer and having a band-gap wider than a band-gap of the electron transport layer.

According to another aspect of the present invention, there is provided a semiconductor element including two or more electrodes formed on the active layer of the semiconductor multi-layer substrate.

In the semiconductor element according, the electrodes may include a Schottky electrode being formed on the active layer and being subjected to Schottky contact with the active layer and an ohmic electrode formed on the active layer and being subjected to ohmic contact with the active layer.

In the semiconductor element, the electrodes may include two ohmic electrodes being formed on the active layer and being subjected to ohmic contact with the active layer and a Schottky electrode being formed on the active layer, being disposed between the two ohmic electrodes, and being subjected to Schottky contact with the active layer.

In the semiconductor element, the electrodes may include two ohmic electrodes being formed on the active layer and being subjected to ohmic contact with the active layer, an insulation film formed on the active layer and disposed between the two ohmic electrodes, and an electrode formed on the insulation film.

In the semiconductor element, the active layer may have a multi-layer structure of an electron transit layer and an electron supply layer being formed on the electron transit layer and having a band-gap wider than a band-gap of the electron transport layer, and a formula (1) below holds true:

$$\frac{d_0 + d_1}{d_1 + d_2 + d_3} \geq \frac{\varepsilon}{en_s(d_1 + d_2 + d_3)}(V - V_1) \quad (1)$$

where e is elementary charge, $n_s$ is a concentration of two-dimensional electron gas at an interface between the electron transit layer and the electron supply layer, $d_0$ is a thickness of the electron transit layer, $d_1$ is distance between an upper surface of the electric-field relaxation layer and an upper surface of the electric-field control layer, $d_2$ is a thickness of the electric-field control layer, $d_3$ is a thickness of the buffer layer, $\in$ indicates dielectric constant of the electron transit layer and the electric-field relaxation layer, V is a voltage applied to the electrode, and $V_1$ is potential of the electric-field control layer.

In the semiconductor element, a formula (2) below may hold true.

$$\frac{d_0 + d_1}{d_1 + d_2 + d_3} \geq \frac{\varepsilon}{en_s} \cdot \frac{1}{d_1 + 2(d_2 + d_3)} V \quad (2)$$

In the semiconductor element according to the present invention, a formula (3) below holds true.

$$\frac{d_0 + d_1}{d_1 + d_2 + d_3} \geq \frac{\varepsilon}{en_s(d_1 + d_2 + d_3)} \cdot \frac{V}{2} \quad (3)$$

In the semiconductor element according to the present invention, a formula (4) below holds true:

$$\frac{R_{on}}{r_{sheet}} W \geq L_{ac} \geq \sqrt{\frac{\varepsilon V}{eN_s}} \quad (4)$$

where $R_{on}[\Omega]$ is a specification value for an on-resistance required for the semiconductor element, $r_{sheet}[\Omega \cdot \square]$ is an average value for a sheet resistance between the electrodes, $N_s[cm^{-3}]$ is an average value for carrier density between the electrodes, $L_{ac}$ is an inter-electrode distance between the electrodes, and W is width of a path of an electric current between the electrodes.

Advantageous Effects of Invention

The present invention obtains an effect of reducing the total thickness of the nitride semiconductor layers relative to the necessary withstand voltage.

DESCRIPTION OF EMBODIMENTS

Figure 1:
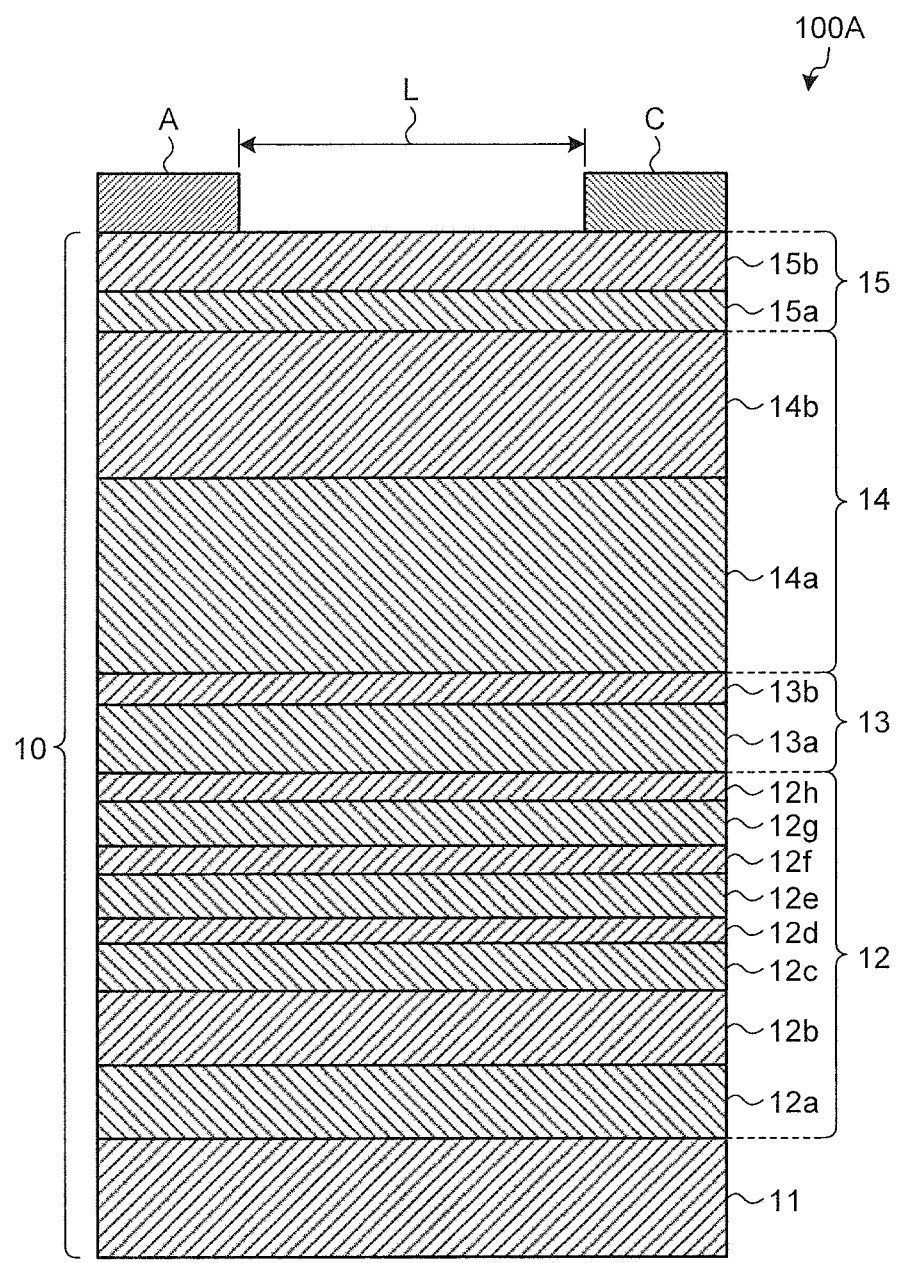
FIG. 1 is a schematic cross section of a semiconductor element according to an embodiment 1.

Hereafter embodiments of the semiconductor multi-layer substrate and the semiconductor element according to the present invention will be described in detail with reference to the drawings. The embodiments do not limit the present invention. In the drawings, the same or corresponding structural elements are assigned with the same reference numerals if necessary. It should be noted that the drawings show schematic examples. Accordingly, a relationship between respective elements may be different from real values. Among the drawings, there may be parts where the relationships and ratios of the shown sizes are different from one another.

Embodiment 1

FIG. 1 is a schematic cross section of a semiconductor element according to an embodiment 1. A semiconductor element 100A is a Schottky Barrier Diode (SBD) including a semiconductor multi-layer substrate 10, and an anode electrode A as an ohmic electrode and a cathode electrode C as a Schottky electrode formed on the semiconductor multi-layer substrate 10.

The semiconductor multi-layer substrate 10 includes a substrate 11, a buffer layer 12 formed on the substrate 11, an electric-field control layer 13 formed on the buffer layer 12, an electric-field relaxation layer 14 formed on the electric-field control layer 13, and an active layer 15 formed on the electric-field relaxation layer 14. The buffer layer 12, the electric-field control layer 13, the electric-field relaxation layer 14, and the active layer 15 are formed on the substrate 11 by epitaxial growth in this order by, for example, an metalorganic chemical vapor deposition (MOCVD) method.

The substrate 11 is an Si (111) substrate. However its main surface may be of an slight slant from a (111) plane within a range of ±10°.

The buffer layer 12 has a configuration in which an AlN layer 12a and an AlGaN layer 12b are layered in this order, and C—GaN layers 12c, 12e, and 12g as GaN layers doped with carbon (C) and AlN layers 12d, 12f, and 12h are layered alternately several times on the AlGaN layer 12b. The buffer layer 12 has a function of alleviating a thermal expansion coefficient difference and a lattice constant difference between the substrate 11 made of Si and a nitride semiconductor layer which is to be layered on the buffer layer 12.

It is preferable that the AlN layers 12a, 12d, 12f, and 12h made of AlN be equal to or greater than 20 nm in thickness since an increase in leakage current is restrained, and that the AlN layers 12a, 12d, 12f, and 12h be equal to or smaller than 60 nm in thickness since a warp or a crack is restrained from being produced on the nitride semiconductor layers on the substrate 11 easily.

It is preferable that the C—GaN layers 12c, 12e, and 12g made of GaN be thick to improve withstand voltage of the semiconductor element 100A to a degree that a warp of a crack can be restrained easily from being produced on the nitride semiconductor layers on the substrate 11. Preferable thicknesses of the C—GaN layers 12c, 12e, and 12g are, for example, 0.1 µm to 0.8 µm.

It is preferable that the number of pairs of the C—GaN layer and the AlN layer be equal to or greater than three to reduce a dislocation in the active layer 15 formed on the buffer layer 12, and it is preferable the number of pairs be equal to or smaller than six to easily restrain a warp or a crack from being produced in the nitride semiconductor layers on the substrate 11.

The electric-field control layer 13 has a structure in which a C—GaN layer 13a as a first layer and an AlN layer 13b as a second layer are layered. A preferable thickness of the C—GaN layer 13a is, for example, 0.1 µm to 0.8 µm. A preferable thickness of the AlN layer 13b is, for example, 20 nm to 60 nm. Two-dimensional electron (2 DEG) gas is produced at an interface of the C—GaN layer 13a with the AlN layer 13b. Therefore, since a plane having a conductivity in the substrate's lateral direction (i.e., a direction of a layer surface of the nitride semiconductor layers on the substrate 11) at the interface of the C—GaN layer 13a with the AlN layer 13b is formed, the electric-field control layer 13 functions as a layer having the conductivity. The electric-field control layer 13 is not limited to be of an AlN/C—GaN structure but may be configured by an n-type GaN layer reduced in resistance by doping with, for example, Si.

The electric-field relaxation layer 14 includes a first electric-field relaxation layer 14a and a second electric-field relaxation layer 14b formed on the first electric-field relaxation layer 14a. The first electric-field relaxation layer 14a is of a multilayer structure in which pairs of the AlN layer and the GaN layer are layered several times. It is preferable that thicknesses of the respective AlN layer and the GaN layer be within a range of, for example, 5 nm to 20 nm. It is preferable that the thickness be equal to or greater than 5 nm since uniformity in thickness of the respective layers are maintained within a surface of the substrate. If the thickness is equal to or smaller than 20 nm, the 2 DEG is restrained from being produced at the interface of the AlN layer with the GaN layer, and thus the resistance in the substrate's lateral direction is configured to be sufficiently high. On the other hand, the second electric-field relaxation layer 14b is of a single layer made of a single composition of C—GaN. As described above, the first electric-field relaxation layer 14a and the second electric-field relaxation layer 14b differ in their layer structures. Herein the difference in the layer structure means that these layers differ in their layering structures or compositions.

The active layer 15 is configured by an electron transit layer 15a made of GaN and an electron supply layer 15b made of AlGaN. 2 DEG, which becomes a channel, is produced at an interface of the electron transit layer 15a with the electron supply layer 15b. It is preferable that the electron supply layer 15b be 20 nm to 30 nm in thickness and 20% to 30% in Al composition since it is possible to increase concentration of the 2 DEG within a range not producing a crack. The electron transit layer 15a may be configured by, for example, undoped GaN or C—GaN. In a case where the electron transit layer 15a is made of C—GaN, it is preferable that a carbon density be lower than $1 \times 10^{18}$ cm$^{-3}$ from a view point of restraining mobility of the two-dimensional electron gas from being reduced. In a case where the carbon density of the electron transit layer 15a is lower than $1 \times 10^{18}$ cm$^{-3}$, or in a case of the undoped GaN, it is preferable that the thickness of the electron transit layer 15a be optimized within a range of 50 nm to 1 µm corresponding to the carbon density, so that a resistance is to a degree that leaking is restrained. For example, in a case of a low carbon density, it is preferable that the thickness be increased.

The anode electrode A is formed on the electron supply layer 15b of the active layer 15 and is subjected to Schottky contact with the 2-DEG channel of the active layer 15. The anode electrode A is configured by, for example, a Ti/Al structure (configuration of thickness is for example, 25 nm/200 nm). The cathode electrode C is formed on the electron supply layer 15b of the active layer 15 and is subjected to ohmic contact with the 2-DEG channel of the active layer 15. The cathode electrode C is configured by, for example, an Ni/Au/Ti structure (configuration of thicknesses is, for example, 100 nm/250 nm/20 nm). A distance between the anode electrode A and the cathode electrode C (inter-electrode distance) of the semiconductor element 100A is indicated by L. The inter-electrode distance is defined as a distance between ends of respective portions, contacting the active layer 15, of the two electrodes.

Herein a plane having a conductivity in a substrate's lateral direction is formed at an AlN/GaN interface of the C—GaN layer 13a with the AlN layer 13b of the electric-field control layer 13 of the semiconductor element 100A, and the plain functions as a layer having the conductivity. As a result, the AlN/GaN interface acts to be always equipotential. By using this property, it is possible to adjust ratios of electric fields formed in the electric-field relaxation layer 14 and the buffer layer 12 respectively at a reverse bias by setting ratios of the thicknesses of the electric-field relaxation layer 14 and the buffer layer 12 sandwiching the electric-field control layer 13. Optimization of the ratio allows reduction in the total thickness of the nitride semiconductor layers (i.e., total thickness between the buffer layer 12 and the active layer 15 existing on the substrate 11) relative to a necessary withstand voltage.

In other words, by interposing the electric-field control layer 13 acting electrically as an equipotential plane between the electric-field relaxation layer 14 and the buffer layer 12, it is possible that three portions, i.e., the electric-field relaxation layer 14 positioned in an area below the anode electrode A, the electric-field relaxation layer 14 positioned below the cathode electrode C, and the buffer layer 12 share the electric field, and its electric field share ratio can be controlled with a ratio of the thickness of the electric-field relaxation layer 14 and the thickness of the buffer layer 12. Therefore, by optimizing the ratio, it is possible to increase the withstand voltage of the nitride semiconductor layer per thickness greater than that in a case where the electric-field control layer 13 is not provided.

Figure 2A:
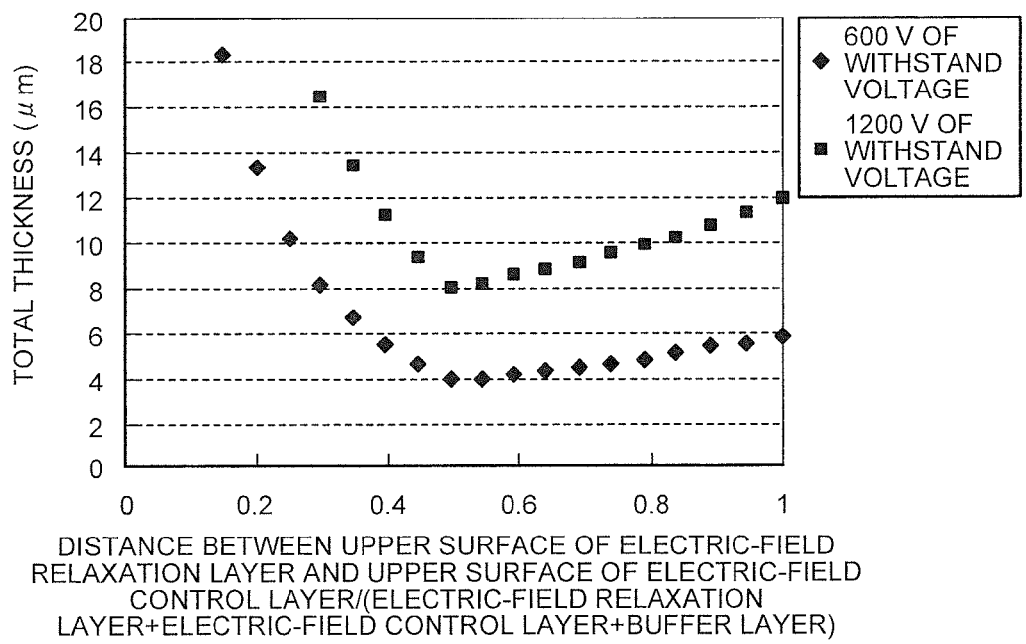
FIG. 2A is a view showing a relationship between a ratio of a thickness of an electric-field relaxation layer relative to a sum of the thickness of the electric-field relaxation layer and a thickness of a buffer layer and a total thickness for achieving a semiconductor element of a 600 V or 1200 V of withstand voltage.
Figure 2B:
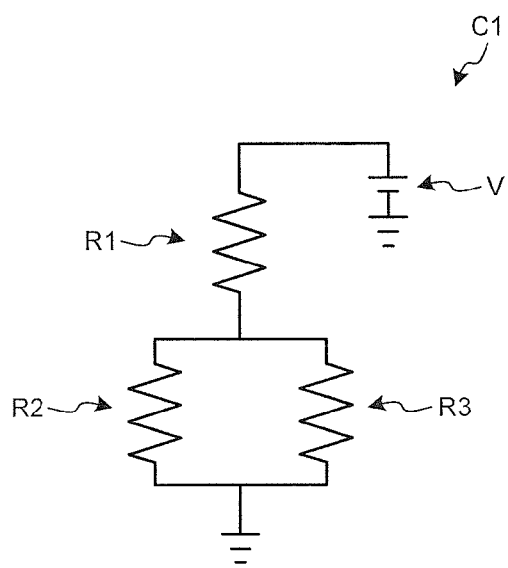
FIG. 2B is a view showing an equivalent circuit for calculating the relationship shown in FIG. 2A.

FIG. 2A is a view showing a relationship between a ratio of thickness of the electric-field relaxation layer relative to the sum of the thicknesses of the electric-field relaxation layer, the electric-field control layer, and the buffer layer and the total thickness achieving the semiconductor element of 600 V or 1200 V of withstand voltage in a case where the semiconductor element 100A is used with an anode ground. FIG. 2B is a view showing an equivalent circuit for calculating the relationship shown in FIG. 2A. An equivalent circuit C1 in FIG. 2B includes a resistance R1, a resistance R2, and a resistance R3. The resistance R1 corresponds to a resistance in a thickness direction of the electric-field relaxation layer 14 below the cathode electrode C. The resistance R2 corresponds to a resistance in a thickness direction of the electric-field relaxation layer 14 below the anode electrode A. The resistance R3 corresponds to a sum of a resistance in a thickness direction of the buffer layer 12 and a resistance in a thickness direction of the electric-field control layer 13. A reference symbol V indicates an external power source. A resistance value of each of the resistances R1, R2, and R3 is set in accordance with the ratio of the thickness of a corresponding layer. Examples of reference values shown for the resistances R1, R2, and R3 are 40 MΩ, 40 MΩ, and 40 MΩ in a case satisfying withstand voltage of 600 V and allowable current of 10 μA when a horizontal axis in FIG. 2A is 0.5 and the total thickness is 4 μm.

In FIG. 2A, a state is assumed that the withstand voltage reaches a level of not tolerating leaking if an electric field of the electric-field relaxation layer 14 or the buffer layer 12 below the anode electrode A exceeds 1 MV/cm in the equivalent circuit C1 in FIG. 2B. That is, the withstand voltage in FIG. 2A is defined to be an applied voltage in a case where the electric field of the electric-field relaxation layer 14 or the buffer layer 12 below the anode electrode A is 1 MV/cm. In addition, a case is assumed that resistivities of the buffer layer 12, the electric-field control layer 13, and the electric-field relaxation layer 14 are uniform.

Moreover, (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) of the horizontal axis of FIG. 2A indicates the thickness of the electric-field relaxation layer 14 relative to the sum of the thicknesses of the electric-field relaxation layer 14, the electric-field control layer 13, and the buffer layer 12. A case where the value of the horizontal axis is one is equivalent to a case where there is not the electric-field control layer 13 substantially and the conductive substrate 11 acts as a layer like the electric-field control layer having the conductivity in the lateral direction, and the electric-field control layer 13 is positioned closer to the active layer 15 if the value of the horizontal axis is closer to zero.

FIG. 2A shows that, if the value of (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) is equal to or smaller than 0.75, the withstand voltage per thickness improves by 20% in comparison to a case where there is not the electric-field control layer 13 (in a case where the horizontal axis is one). It is also shown that, if the value of (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) is approximately 0.5, that is, if the electric-field control layer 13 is disposed in the vicinity of a midpoint of a thickness as that sum of the thickness of the electric-field relaxation layer 14 and the thickness of the buffer layer 12, the necessary withstand voltage can be obtained with the smallest thickness and the necessary thickness can be reduced by 33% at maximum in comparison to a case where there is not the electric-field control layer 13. Alternatively, if (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) exceeds 0.8, a layer having a thickness of at least equal to or greater than 4 μm in a case of 600 V of withstand voltage or a layer having a thickness of at least equal to or greater than 8 μm in a case of 1200 V of withstand voltage must be configured by only the electric-field relaxation layer, thus there is a case where production thereof is difficult. Therefore, as shown in FIG. 2A, (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) is preferable to be within a range of 0.3 to 0.8, more preferable to be within a range of 0.3 to 0.7, and further preferable to be within a range of 0.4 to 0.7.

From the result of FIG. 2A, the thickness relative to the necessary withstand voltage can be reduced by, for example, making the thickness of the first electric-field relaxation layer 14a 1 μm to 4 μm (the number of pairs of the AlN layer and the GaN layer is, for example, 40 to 160), making the thickness of the second electric-field relaxation layer 14b as a single layer made of C—GaN 100 nm to 2 μm, and making (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) within a range of 0.3 to 0.8, preferably within a range of 0.3 to 0.7, and further preferably within a range of 0.4 to 0.7, when achieving a semiconductor element of the 600 V or 1200 V of withstand voltage.

Study by the inventors of the present invention has revealed that, in the configuration disclosed in Patent Literature 2, although the pair of the GaN layer and the AlN layer located at the top of the buffer layer functions as the electric-field control layer in the semiconductor element 100A, it is difficult to control a warp or a crack since the electric-field relaxation layer is configured by single C—GaN, thus the upper limit of the thickness of the electric-field relaxation layer that can be grown without producing a crack is 1.2 μm and the upper limit of the thickness of the buffer layer is approximately 3.2 μm. This indicates that the conventional technology has a problem in two points below. Firstly, in a case where the electric-field relaxation layer and the buffer layer are grown to the upper limits, the sum of the thicknesses of the electric-field relaxation layer and the buffer layer reaches 4.4 μm, and this is equivalent to a case of (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER)=0.27, and thus considering from the result of FIG. 2A, in the configuration disclosed in Patent Literature 2, the withstand voltage per thickness is lower than that in a case where there is not the electric-field control layer. Therefore, it is difficult to achieve, for example, 600 V of withstand voltage. Secondly, although a means of assuming a configuration may be contrived that is preferable for improving the withstand voltage per thickness with a thickness of the buffer layer that is lower than a upper limit, for example, 1.2 µm and with (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+ BUFFER LAYER)=0.5, the sum of the thicknesses of the electric-field relaxation layer and the buffer layer is 2.4 µm at maximum since a conventional technology merely achieves 1.2 µm as the upper limit of the thickness of the electric-field relaxation layer, thus a thickness necessary for achieving the withstand voltage, for example, 600 V or the like cannot be obtained. As described above, the conventional technology is considered to be difficult to optimize the (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) and achieve the sum of the greater thicknesses simultaneously, and thus achieve a crystal having a desirable withstand voltage.

Figure 3A:
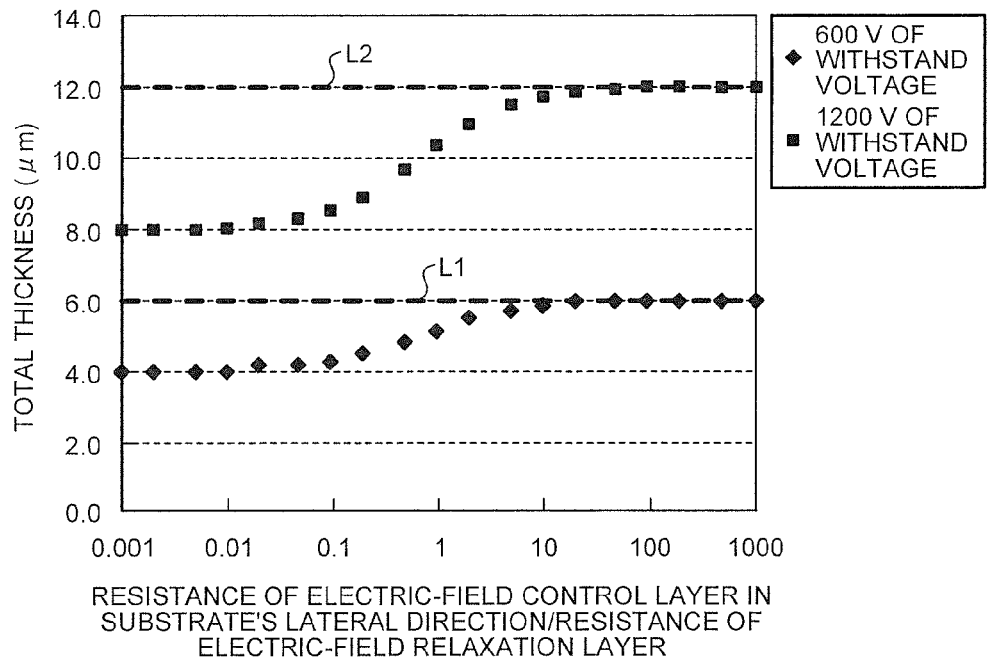
FIG. 3A is a view showing a relationship between a ratio of a resistance of an electric-field control layer in a substrate's lateral direction necessary to achieve the semiconductor element of the 600 V and 1200 V of withstand voltage relative to the resistance of the electric-field relaxation layer and the sum of the thicknesses.
Figure 3B:
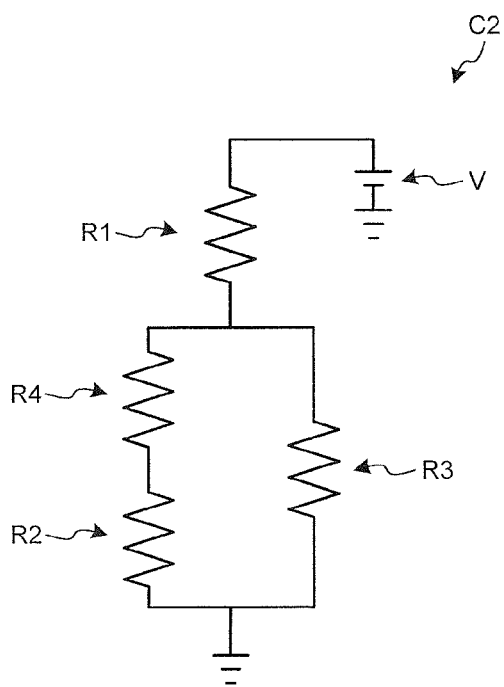
FIG. 3B is a view showing an equivalent circuit for calculating the relationship shown in FIG. 3A.

It is preferable that the resistance in its substrate's lateral direction of the electric-field control layer 13 be equal to or smaller than 10 times the resistance of the electric-field relaxation layer 14. FIG. 3A is a view showing a relationship between a ratio of a resistance of the electric-field control layer in the substrate's lateral direction in the semiconductor element 100A necessary to achieve the semiconductor element of the 600 V and 1200 V of withstand voltage relative to a resistance of the electric-field relaxation layer. FIG. 3B is a view showing an equivalent circuit for calculating the relationship shown in FIG. 3A. An equivalent circuit C2 in FIG. 3B includes a resistance R1 corresponding to a resistance in the thickness direction of the electric-field relaxation layer 14 below the cathode electrode C, a resistance R2 corresponding to a resistance in the thickness direction of the electric-field relaxation layer 14 below the anode electrode A, a resistance R3 which is equivalent to the sum of the resistance in the thickness direction of the buffer layer 12 and the resistance in the thickness direction of the anode electrode A, and a resistance R4 that is equivalent to the resistance in the substrate's lateral direction of the electric-field control layer 13 (resistance between, and below, the cathode electrode C and the anode electrode A).

The value of the (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+ BUFFER LAYER) was made (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+ BUFFER LAYER)=0.5 that is a configuration capable of minimizing the sum of the thicknesses necessary for achieving the desirable withstand voltage. In FIG. 3A, lines L1 and L2 indicate total thicknesses respectively that are necessary for achieving semiconductor elements of 600 V and 1200 V of withstand voltages in the configuration of Patent Literature 1 as the conventional technology.

As shown in FIG. 3A, it is preferable that the resistance in the substrate's lateral direction of the electric-field control layer 13 be equal to or smaller than 10 times the resistance of the electric-field relaxation layer 14 to reduce the necessary total thickness effectively from the total thickness necessary in a case of using the conventional technology. It is more preferable that the resistance in the substrate's lateral direction of the electric-field control layer 13 be equal to or smaller than 0.1 times since the necessary total thickness is minimized. A case where the resistance in the substrate's lateral direction of the electric-field control layer 13 is equal to or smaller than one time the resistance of the electric-field relaxation layer 14 is preferable since the necessary total thickness is equal to or smaller than an approximate intermediate value between the total thickness that is necessary in a case of using the conventional technology and the minimum value of the necessary total thickness.

The 600 V and 1200 V of withstand voltages in FIGS. 2A and 3A are mere examples and other withstand voltage values tend to be similar to those in FIGS. 2A and 3A.

The electric-field relaxation layer 14 is made by two layers that are different in their layer structures from each other, i.e., a first electric-field relaxation layer 14a and a second electric-field relaxation layer 14b. The first electric-field relaxation layer 14a is further made by a plurality of layers. Hereby since a warp or a crack is controlled more easily when achieving thicknesses of layers than in a case of configuring the same thickness of electric-field relaxation layer with a single layer made of GaN layer or the like, it is easier to make the value of the (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+BUFFER LAYER) in FIG. 2A within a preferable range of 0.4 to 0.7.

In order to restrain a leakage current at a time of applying a withstand voltage (Vb) required for the semiconductor element 100A equal to or under a required current value (IL), it is preferable that the resistances of the electric-field relaxation layer 14 and the buffer layer 12 per a unit thickness be greater than Vb/(IL·dt) that is a value obtained by dividing Vb/IL with a sum dt of a thickness of the active layer 15, the thickness of the electric-field relaxation layer 14, the thickness of the electric-field control layer 13, and the thickness of the buffer layer 12.

For example, in a case of attempting to produce the semiconductor element 100A of a 600 V of withstand voltage and 90 µA of leakage current value so that the horizontal axis in FIG. 2A satisfies to be within an area of 0.4 to 0.7, it is preferable that the resistances of the electric-field relaxation layer 14 and the buffer layer 12 per a unit thickness be 1.1 MΩ/µm to 1.7 MΩ/µm.

In consideration of the above-described condition for the resistance per a unit thickness combined with the result in FIG. 2A, it is preferable that a relationship of $0.3 \leq a/(a+b) \leq 0.8$ hold true, it is more preferable that a relationship of $0.3 \leq a/(a+b) \leq 0.7$ hold true, and it is furthermore preferable that a relationship of $0.4 \leq a/(a+b) \leq 0.7$ hold true where a thickness a indicates an area, including the active layer 15 and the electric-field relaxation layer 14, of which resistance per a unit thickness is greater than a value indicated by Vb/(IL·dt) and a thickness b indicates an area, including the electric-field control layer 13 and the buffer layer 12, of which resistance per a unit thickness is greater than a value indicated by Vb/(IL·dt).

Although there may be, for example, carbon doping as a means of increasing resistances of the electric-field relaxation layer 14, the electric-field control layer 13, and the buffer layer 12, it is preferable that the carbon densities of the electric-field relaxation layer 14, the electric-field control layer 13, and the buffer layer 12 be within a range of $1\times10^{18}$ $cm^{-3}$ to $1\times10^{20}$ $cm^{-3}$. If the carbon density is equal to or greater than $1\times10^{18}$ $cm^{-3}$, it is preferable because the resistance per a unit thickness increases to a necessary value, and if the carbon density is equal to or lower than $1\times10^{20}$ $cm^{-3}$, it is preferable because a distortion of a crystal lattice does not grow and from a view point of restraining a crack from being produced.

In this case, it is preferable that a relationship of $0.3 \leq c/(c+d) \leq 0.8$ hold true, it is more preferable that a relationship of $0.3 \leq c/(c+d) \leq 0.7$ hold true, and it is furthermore preferable that a relationship of $0.4 \leq a/(c+d) \leq 0.7$ hold true where c indicates a thickness of an area, including the active layer 15 and the electric-field relaxation layer 14, of which carbon density is $1\times10^{18}$ $cm^{-3}$ to $1\times10^{20}$ $cm^{-3}$, and d indicates a thickness of an area, including the electric-field control layer 13 and the buffer layer 12, of which carbon density is $1\times10^{18}$ $cm^3$ to $1\times10^{20}$ $cm^{-3}$.

A method of producing the semiconductor element 100A according to the above-described embodiment 1 will be exemplified as follows.

At first, the buffer layer 12, the electric-field control layer 13, and the electric-field relaxation layer 14 are subjected to epitaxial growth in this order on the substrate 11 by using an MOCVD method. For a material gas for growing a layer made of GaN, trimethylgallium (TMG) and ammonia (NH$_3$) can be used. For a material gas for growing a layer made of AlN, trimethylaluminium (TMA) and NH$_3$ can be used. For example, 900 to 1000 degrees of crystal growth temperature is preferable for any one of the layers. By using the above-described material gas, carbon contained in the material gas is doped during the crystal growth.

Next, the active layer 15 is subjected to epitaxial growth on the electric-field relaxation layer 14. For the material gas for growing the layer made of GaN, TMG and NH$_3$ can be used. For a material gas for growing a layer made of AlGaN, TMG, TMA, and NH$_3$ can be used. For example, 1000 to 1050 degrees of crystal growth temperature is preferable for any one of the layers.

Next, the anode electrode A and the cathode electrode C are formed on the active layer 15. For example, a sputtering method can be used for forming each electrode. It is preferable that the cathode electrode C formed by using the sputtering method or the like be subjected to annealing within a temperature range of, for example, 500 to 700 degrees for reducing a contact resistance to the 2 DEG.

As described above, the semiconductor element 100A according to the present embodiment 1 is capable of reducing the total thickness of the nitride semiconductor layers relative to the necessary withstand voltage; and thus, production cost therefor is reduced.

Embodiment 2

Figure 4:
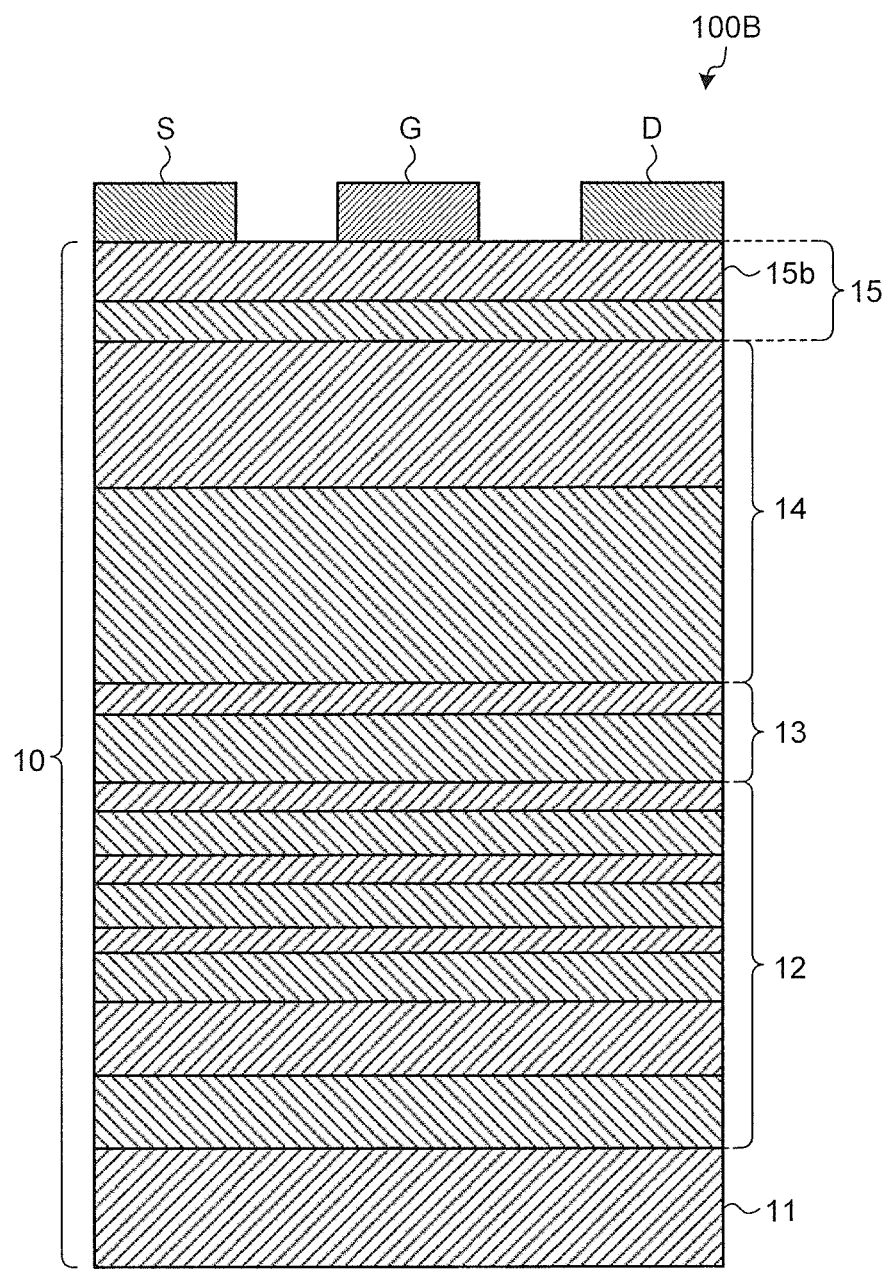
FIG. 4 is a schematic cross section of a semiconductor element according to an embodiment 2.

FIG. 4 is a schematic cross section of a semiconductor element according to an embodiment 2. A semiconductor element 100B is a High Electron Mobility Transistor (HEMT) type of field effect transistor (FET) including a source electrode S, a gate electrode G, and a drain electrode D in place of the anode electrode A and the cathode electrode C of the semiconductor element 100A according to the embodiment 1.

The source electrode S and the drain electrode D formed on the electron supply layer 15b of the active layer 15 form an ohmic contact with the 2-DEG channel of the active layer 15. The source electrode S and the drain electrode D are configured by, for example, an Ni/Au/Ti structure (configuration of the thicknesses is, for example, 100 nm/250 nm/20 nm). The gate electrode G formed on the electron supply layer 15b of the active layer 15 forms a Schottky contact with the active layer 15. The gate electrode G is disposed between the source electrode S and the drain electrode D. The gate electrode G is configured by, for example, a Ti/Al structure (configuration of the thicknesses is, for example, 25 nm/200 nm).

The semiconductor element 100B according to the present embodiment 2 obtains an effect, similar to that of the semiconductor element 100A, i.e., of reducing the total thickness of the nitride semiconductor layers relative to the necessary withstand voltage; and thus a production cost therefor is reduced.

Embodiment 3

Figure 5:
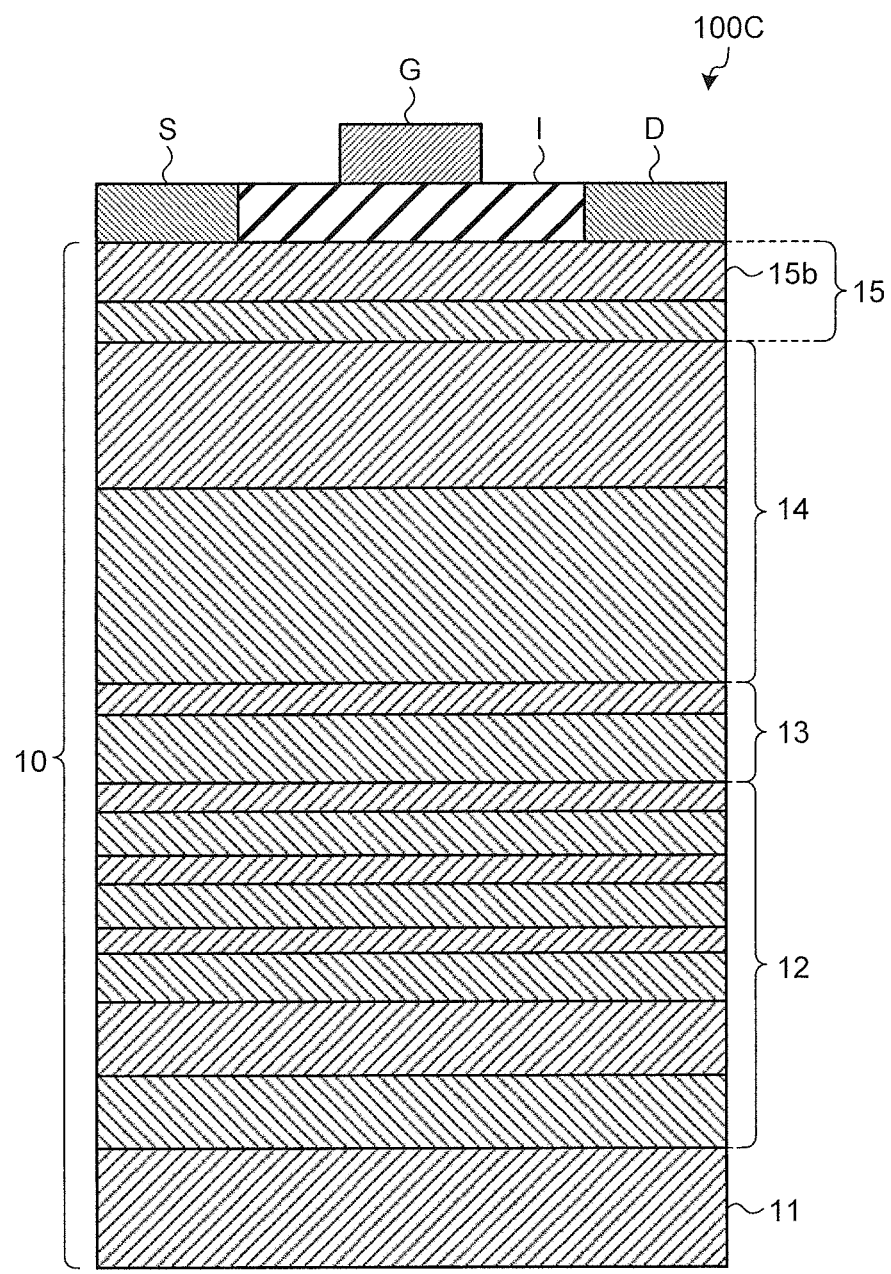
FIG. 5 is a schematic cross section of a semiconductor element according to an embodiment 3.

FIG. 5 is a schematic cross section of a semiconductor element according to an embodiment 3. A semiconductor element 100C is an MOS-type of FET in which a gate insulating film I is formed between the source electrode S and the drain electrode D on the electron supply layer 15b of the active layer 15 of the semiconductor element 100B according to the embodiment 2 and the gate electrode G forms a Schottky contact with the gate insulating film I. The gate insulating film I is made of, for example, an SiO$_2$ film having a thickness of 30 nm to 60 nm.

The semiconductor element 100C according to the present embodiment 3 obtains an effect, similar to that of the semiconductor element 100A, i.e., reducing the total thickness of the nitride semiconductor layers relative to the necessary withstand voltage; and thus a production cost therefor is reduced.

Embodiment 4

Figure 6:
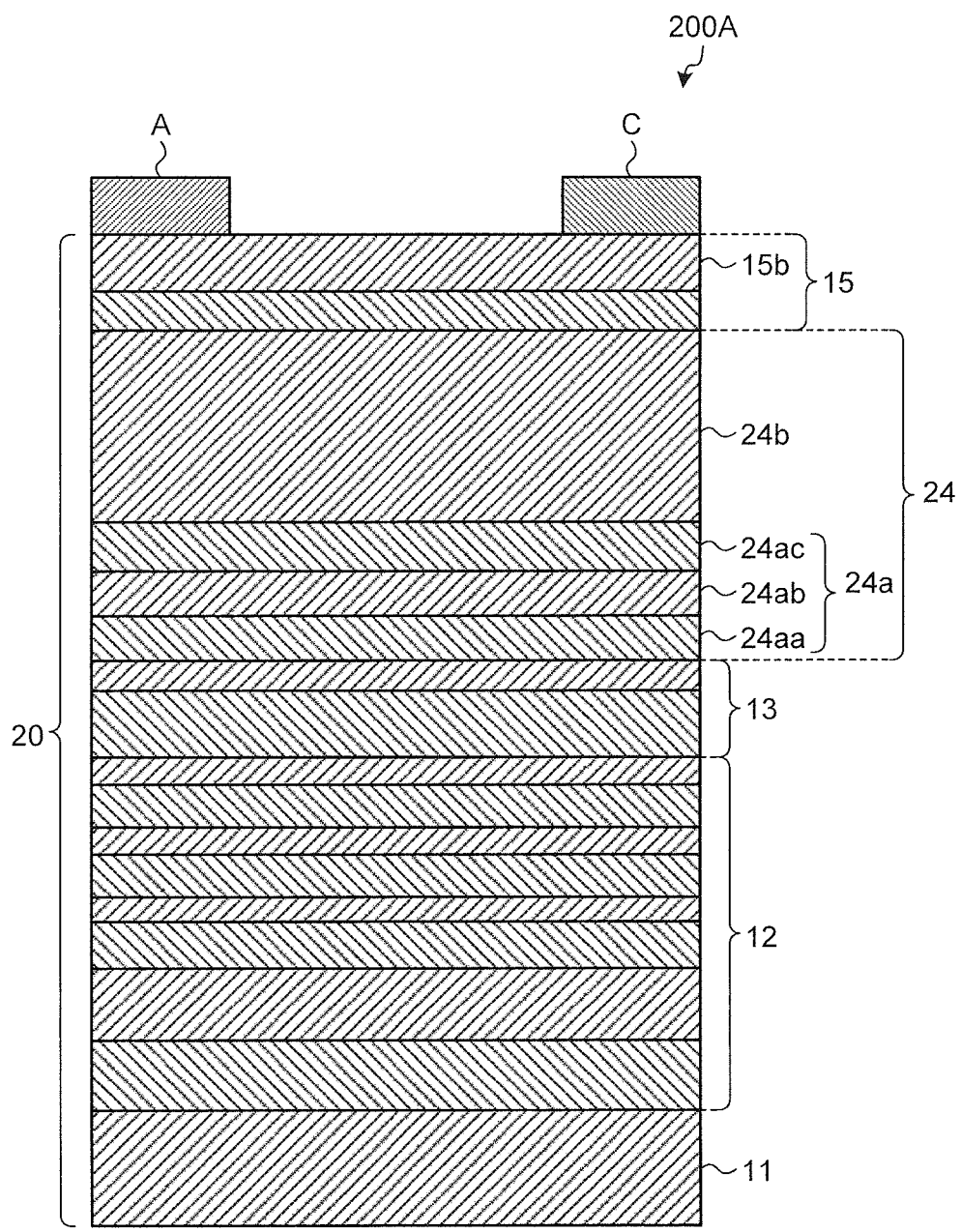
FIG. 6 is a schematic cross section of a semiconductor element according to an embodiment 4.

FIG. 6 is a schematic cross section of a semiconductor element according to an embodiment 4. In a semiconductor element 200A, the semiconductor multi-layer substrate 10 of the semiconductor element 100A according to the embodiment 1 is replaced with a semiconductor multi-layer substrate 20. In the semiconductor multi-layer substrate 20, the electric-field relaxation layer 14 of the semiconductor multi-layer substrate 10 is replaced with an electric-field relaxation layer 24.

The electric-field relaxation layer 24 includes a first electric-field relaxation layer 24a and a second electric-field relaxation layer 24b formed on the first electric-field relaxation layer 24a. The first electric-field relaxation layer 24a includes AlGaN layers 24aa, 24ab, and 24ac formed on the electric-field control layer 13 in this order. On the other hand, the second electric-field relaxation layer 24b is a single layer made of C—GaN. The second electric-field relaxation layer 24b can be of a configuration similar to that of the second electric-field relaxation layer 14b illustrated in FIG. 1.

The AlGaN layers 24aa, 24ab, and 24ac are configured so that Al composition decreases from the substrate 11 side toward a surface direction (active layer 15 side) (i.e., a bandgap becomes narrow). The Al composition in each layer of the AlGaN layers 24aa, 24ab, and 24ac may be uniform, or may decrease toward the active layer 15 side in each layer. It is preferable that the Al composition vary between 20% and 0%. As described above, by configuring the first electric-field relaxation layer 24a with the AlGaN layer having the composition of which Al composition decreases toward the surface direction (active layer 15 side), a crack or a warp can be restrained from being produced.

The electric-field relaxation layer 24 is configured with two layers, i.e., the first electric-field relaxation layer 24a and the second electric-field relaxation layer 24b. The first electric-field relaxation layer 24a is further made by a plurality of layers. Hereby since a warp or a crack is controlled more easily when achieving thicknesses of layers than in a case of configuring the same thickness of electric-field relaxation layer with a single layer made of GaN layer or the like, it is easier to make the value of the (DISTANCE BETWEEN UPPER SURFACE OF ELECTRIC-FIELD RELAXATION LAYER AND UPPER SURFACE OF ELECTRIC-FIELD CONTROL LAYER)/(ELECTRIC-FIELD RELAXATION LAYER+ELECTRIC-FIELD CONTROL LAYER+ BUFFER LAYER) in FIG. 2A within a preferable range.

The semiconductor element 200A according to the present embodiment 4 obtains an effect, similar to that of the semiconductor element 100A, i.e., of reducing the total thickness of the nitride semiconductor layers relative to the necessary withstand voltage; and thus a production cost therefor is reduced.

The number of the AlGaN layers forming the first electric-field relaxation layer 24a is not limited to three and may be equal to or greater than one. A profile of a decrease in the Al composition is not limited specifically and may be any one of, for example, a step-wise manner or a continuous manner.

Embodiment 5

Figure 7:
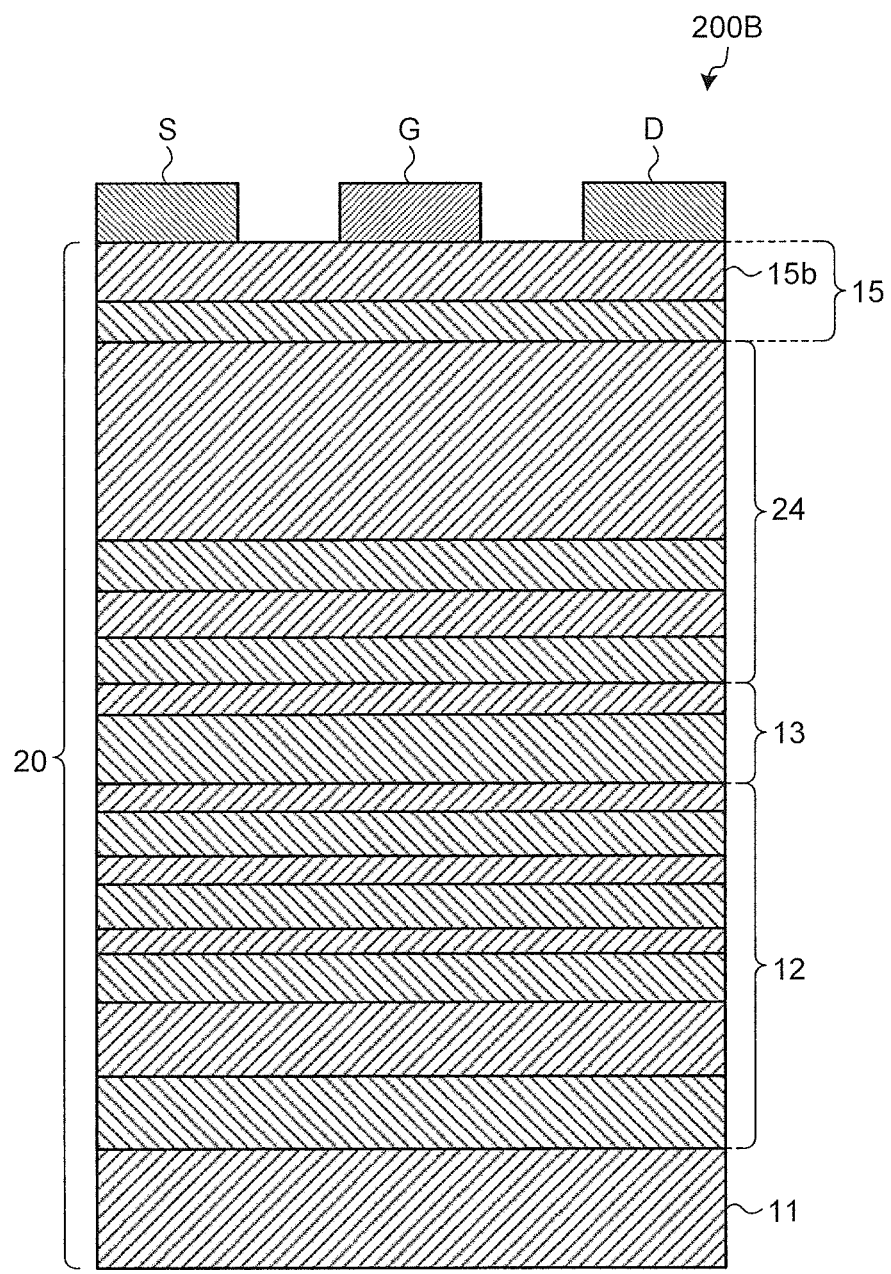
FIG. 7 is a schematic cross section of a semiconductor element according to an embodiment 5.

FIG. 7 is a schematic cross section of a semiconductor element according to an embodiment 5. A semiconductor element 200B is an HEMT type of FET including the source electrode S, the gate electrode G, and the drain electrode D in place of the anode electrode A and the cathode electrode C of the semiconductor element 200A according to the embodiment 4.

The semiconductor element 200B according to the present embodiment 5 obtains an effect, similar to that of the semiconductor element 200A, i.e., reducing the total thickness of the nitride semiconductor layers relative to the necessary withstand voltage; and thus a production cost therefor is reduced.

Embodiment 6

Figure 8:
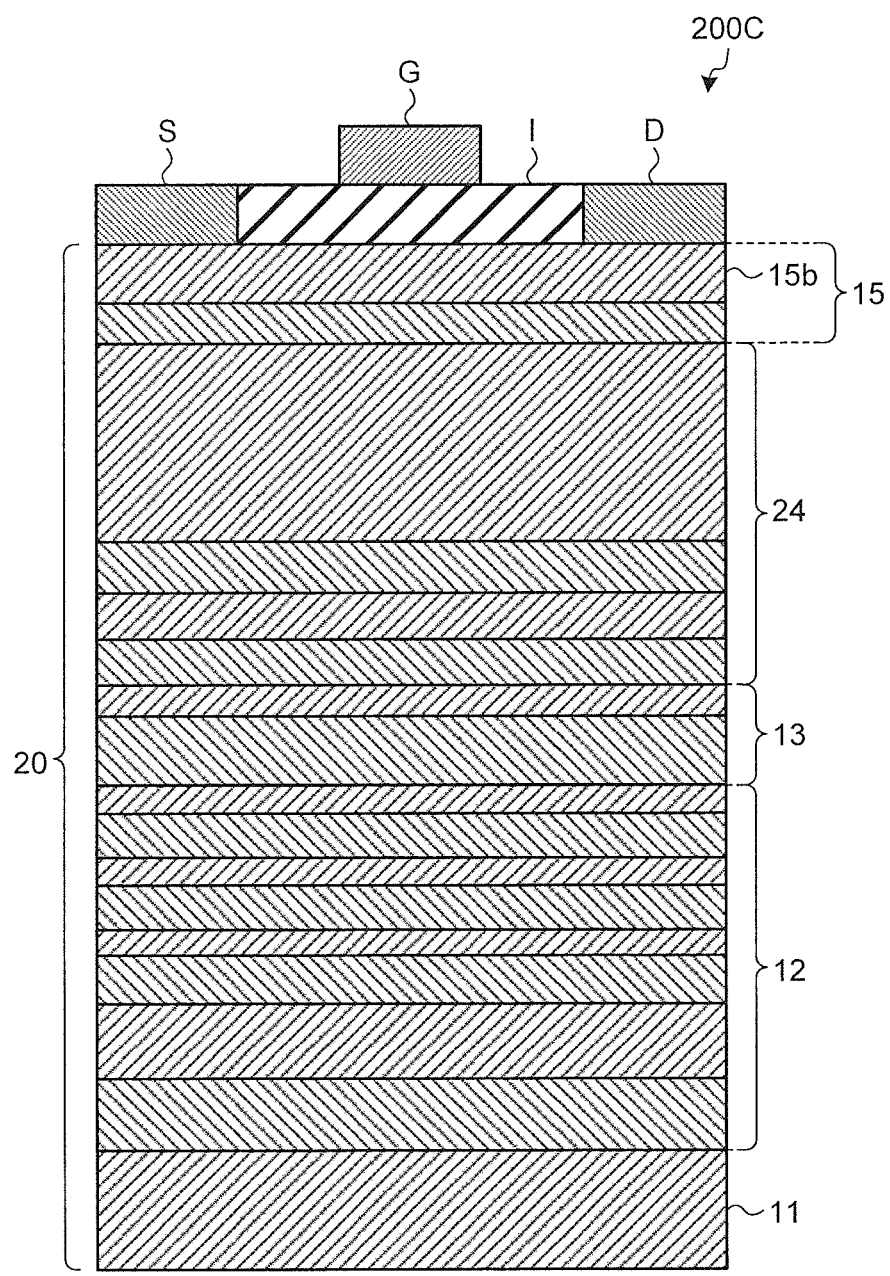
FIG. 8 is a schematic cross section of a semiconductor element according to an embodiment 6.

FIG. 8 is a schematic cross section of a semiconductor element according to an embodiment 6. A semiconductor element 200C is an MOS-type of FET in which the gate insulating film I is formed between the electron supply layer 15b of the active layer 15 and the gate electrode G of the semiconductor element 200B according to the embodiment 5.

The semiconductor element 200C according to the present embodiment 6 obtains an effect, similar to that of the semiconductor element 200A, i.e., reducing the total thickness of the nitride semiconductor layers relative to the necessary withstand voltage; and thus a production cost therefor is reduced.

Embodiment 7

Figure 9:
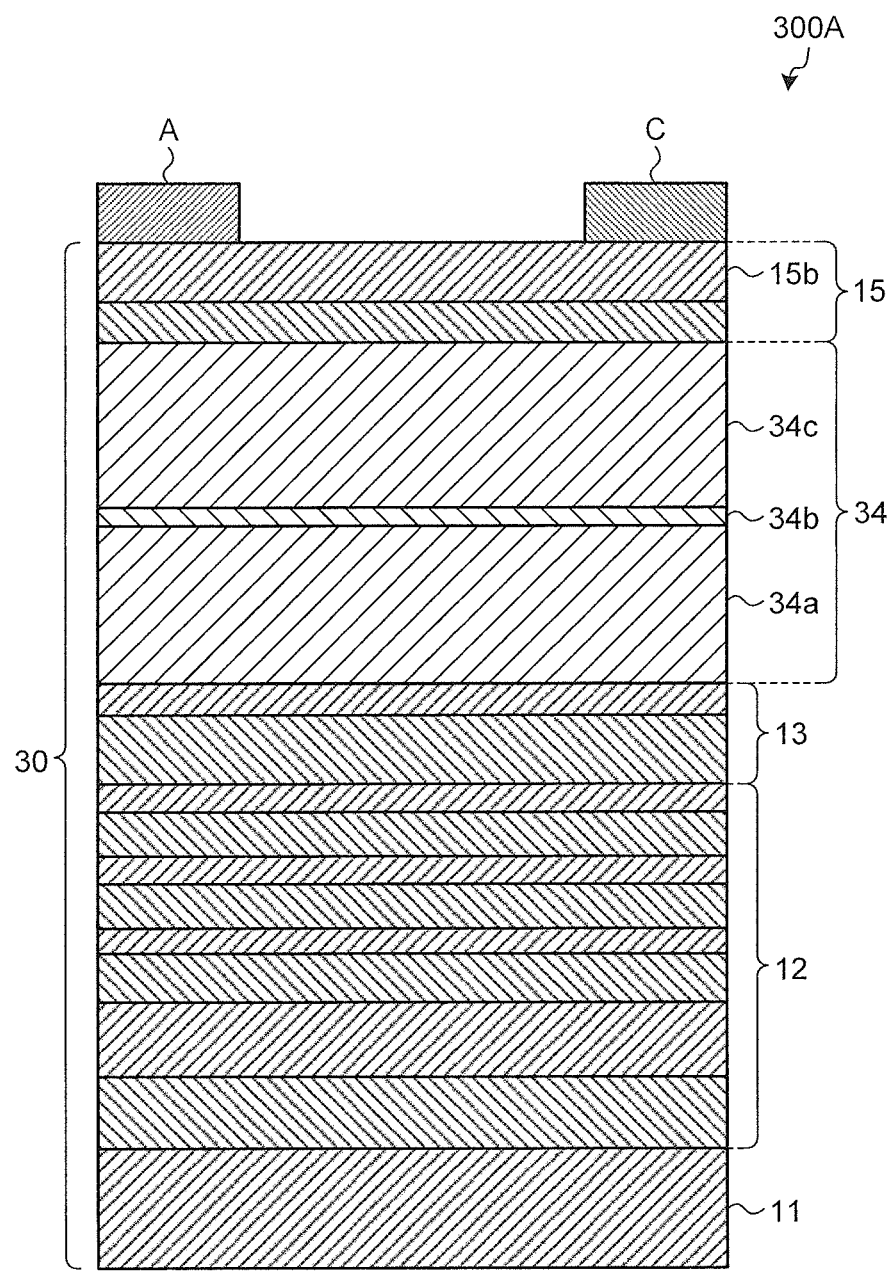
FIG. 9 is a schematic cross section of a semiconductor element according to an embodiment 7.

FIG. 9 is a schematic cross section of a semiconductor element according to an embodiment 7. In a semiconductor element 300A, the semiconductor multi-layer substrate 10 of the semiconductor element 100A according to the embodiment 1 is replaced with a semiconductor multi-layer substrate 30. In the semiconductor multi-layer substrate 30, the electric-field relaxation layer 14 of the semiconductor multi-layer substrate 10 is replaced with an electric-field relaxation layer 34.

The electric-field relaxation layer 34 includes a C—GaN layer 34a, an AlN layer 34b formed on the C—GaN layer 34a, and a C—GaN layer 34c formed on the AlN layer 34b.

It is preferable that the thickness of the AlN layer 34b be within a range of 0.5 nm to 20 nm. By making the thickness equal to or smaller than 20 nm, an equipotential plane is prevented from being formed by a 2 DEG produced at an interface of the AlN layer 34b with the C—GaN layers 34a and 34c. Since, if the equipotential plane is produced on the electric-field relaxation layer, a relationship between the thickness of the electric-field relaxation layer and the thickness of the buffer layer, that is necessary for optimizing the withstand voltage per the thickness shown in FIG. 2A may break and a desirable effect cannot be obtained sometimes, the above-described thickness is preferable.

The semiconductor element 300A according to the present embodiment 7 obtains an effect, similar to that of the semiconductor element 100A, i.e., reducing the total thickness of the nitride semiconductor layers relative to the necessary withstand voltage; and thus a production cost therefor is reduced.

Embodiment 8

Figure 10:
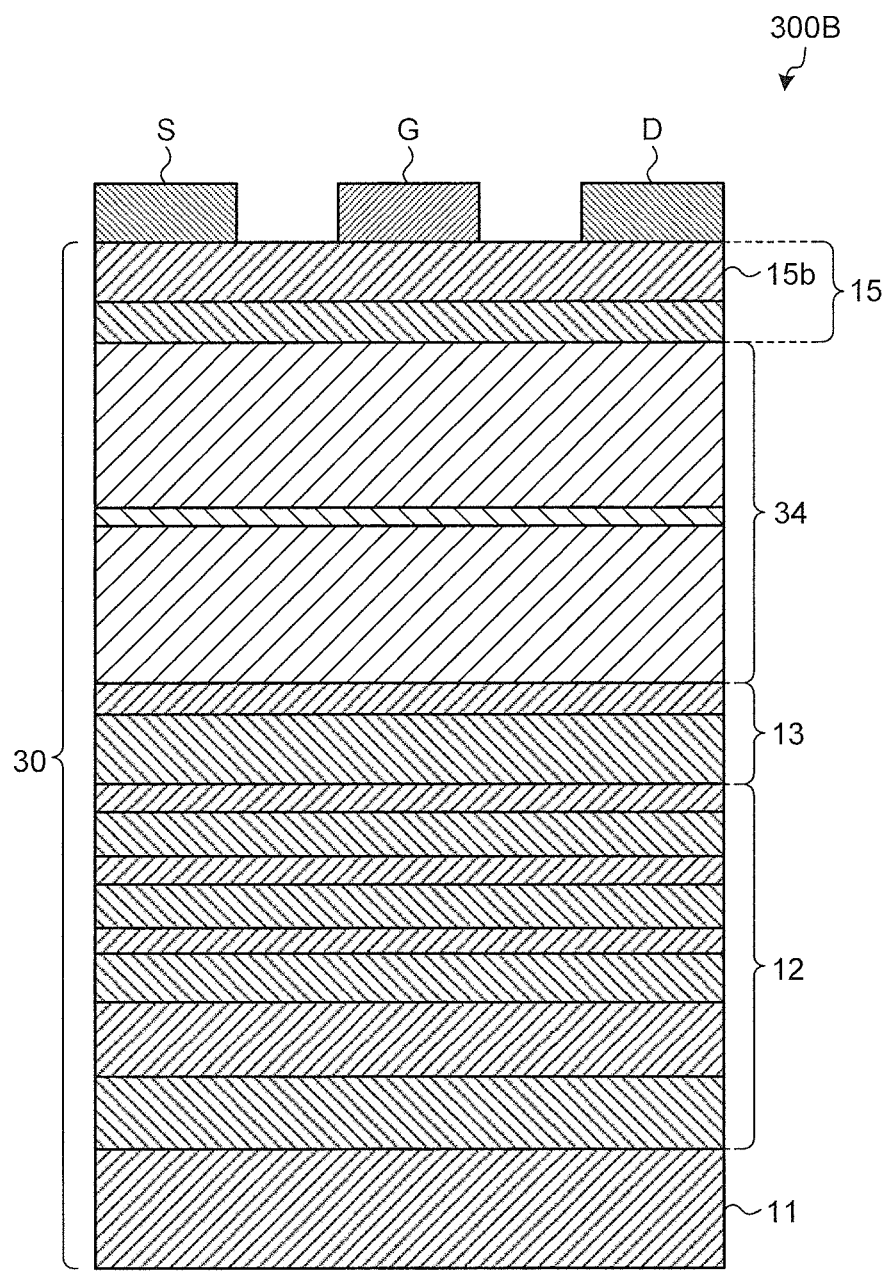
FIG. 10 is a schematic cross section of a semiconductor element according to an embodiment 8.

FIG. 10 is a schematic cross section of a semiconductor element according to an embodiment 8. A semiconductor element 300B is an HEMT-type of FET including the source electrode S, the gate electrode G, and the drain electrode D, in place of the anode electrode A and the cathode electrode C of the semiconductor element 300A according to the embodiment 7.

The semiconductor element 300B according to the present embodiment 8 obtains an effect, similar to that of the semiconductor element 300A, i.e., reducing the total thickness of the nitride semiconductor layers relative to the necessary withstand voltage; and thus a production cost therefor is reduced.

Embodiment 9

Figure 11:
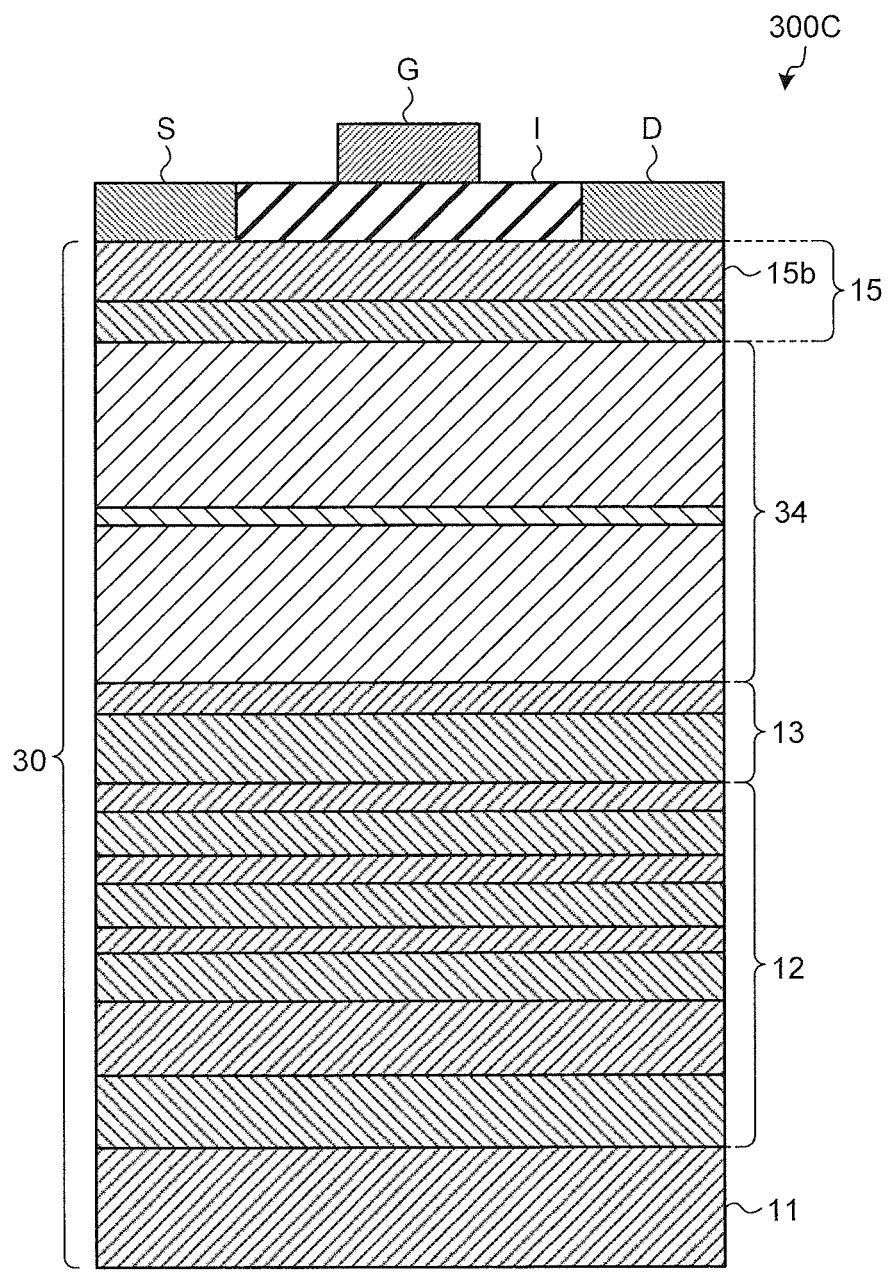
FIG. 11 is a schematic cross section of a semiconductor element according to an embodiment 9.

FIG. 11 is a schematic cross section of a semiconductor element according to an embodiment 9. A semiconductor element 300C is an MOS-type of FET in which the gate insulating film I is formed between the electron supply layer 15b and the gate electrode G of the semiconductor element 300B according to the embodiment 8.

The semiconductor element 300C according to the present embodiment 9 obtains an effect, similar to that of the semiconductor element 300A, i.e., reducing the total thickness of the nitride semiconductor layers relative to the necessary withstand voltage; and thus a production cost therefor is reduced.

Embodiment 10

Figure 12:
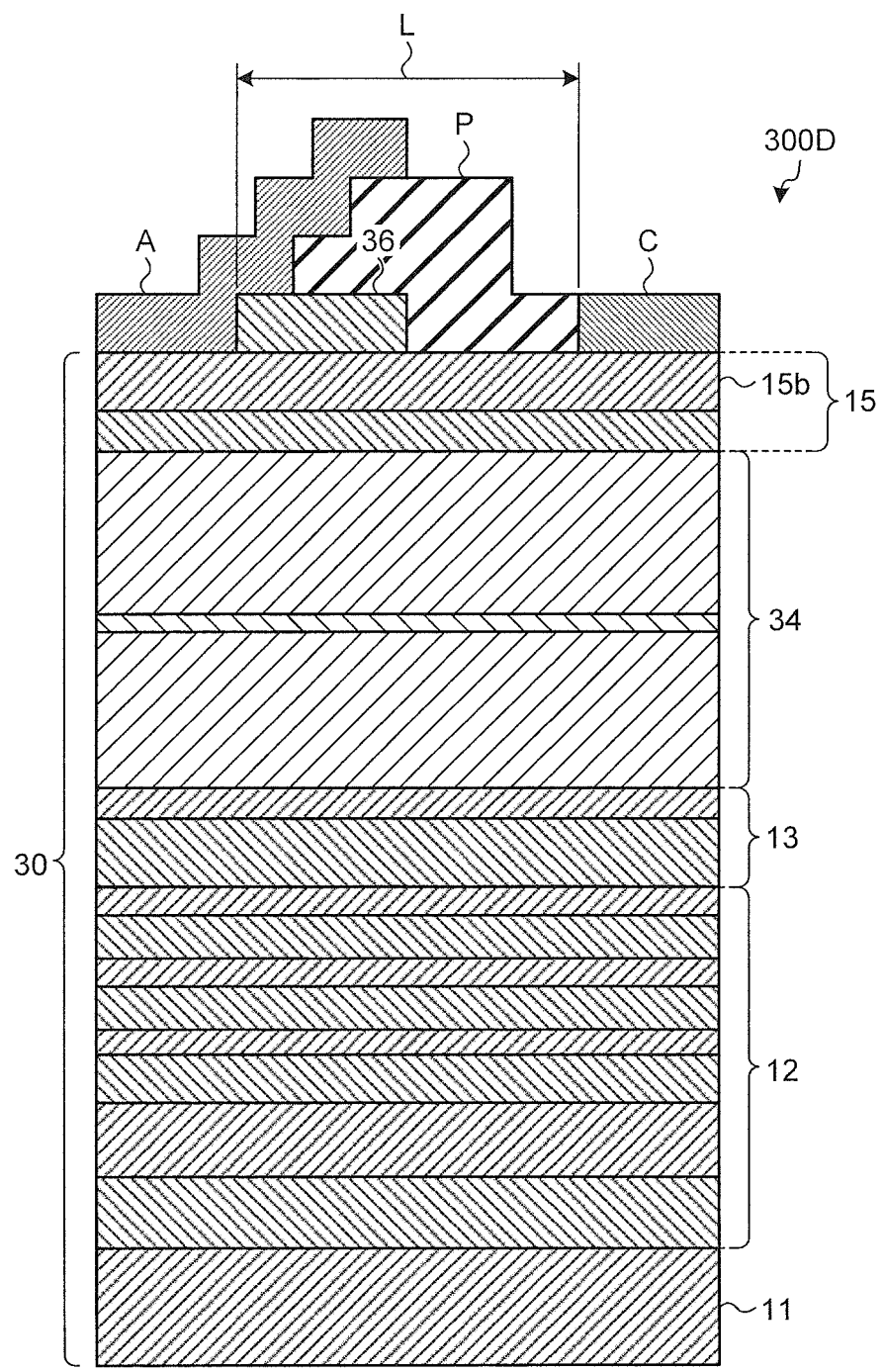
FIG. 12 is a schematic cross section of a semiconductor element according to an embodiment 10.

FIG. 12 is a schematic cross section of a semiconductor element according to an embodiment 10. A semiconductor element 300D is an SBD in which, in the semiconductor element 100A according to the embodiment 1, a field plate layer 36 is formed on the electron supply layer 15b of the active layer 15 to contact the anode electrode A, a protection film P is formed to cover a surface of the active layer 15 between the anode electrode A and the cathode electrode C and a part of a surface of the field plate layer 36, and the anode electrode A is formed to override stepwise on the protection film P. The protection film P is made of, for example, an $SiO_2$ film. The field plate layer 36 is made of a nitride semiconductor material of which band-gap energy is lower than that of the electron supply layer 15b, for example, GaN. Also in the semiconductor element 300D, L as an inter-electrode distance indicates a distance between ends of portions, contacting the active layer 15, of the two electrodes (the anode electrode A and the cathode electrode C).

The semiconductor element 300D according to the present embodiment 10 obtains an effect, similar to that of the semiconductor element 300A, i.e., reducing the total thickness of the nitride semiconductor layers relative to the necessary withstand voltage; and thus a production cost therefor is reduced.

Moreover, in the semiconductor element 300D, the field plate layer 36 reduces the density of the 2 DEG at the interface of the electron transit layer 15a with the electron supply layer 15b immediately below the field plate layer 36. Therefore, the 2 DEG becomes depleted easily by a low voltage when a reverse voltage is applied. Since the anode electrode A is in a stepped shape having a plurality of steps and has a plurality of corner portions at which an electric field intensity tends to increase, the electric field is dispersed at these corner portions; thus a peak electric field intensity is lowered. As a result, the semiconductor element 300D becomes an element of which withstand voltage is improved.

By the way, the inventors of the present invention confirmed that, in a case where, for example, the semiconductor element 100A according to the embodiment 1 is pulse-driven by grounding the anode electrode A and the substrate 11 at the backside to be equipotential and applying, for example, 600 V of high voltage stress, there is a phenomenon that a current collapse component recovering at 10 µs order is revealed.

From an assiduous study, the inventors of the present invention assumed that, in the case of grounding the anode electrode A and the substrate 11 at the backside to be equipotential, the 2 DEG as a path of an electric current produced in the active layer 15 is extracted from a side of the buffer layer 12 and becomes depleted easily, and then, an electric field concentration occurs at the end of the cathode electrode C. The inventors of the present invention assumed that the electric field concentration at the end of the cathode electrode C produces the current collapse component recovering at 10 µs order.

The inventors of the present invention assumed that the depletion by the extraction of the 2 DEG occurs when a condenser formed between the electric-field control layer 13 and the electron supply layer 15b is charged. The inventors of the present invention considered that, since the 2 DEG does not become depleted completely by making the charge amount which the condenser can charge lower than the charge amount of the 2 DEG, the electric field concentration is restrained at the end of the cathode electrode C, thus the current collapse component caused by this can be restrained also.

The following formula indicates a condition that the charge amount which the condenser can charge is lower than the charge amount of the 2 DEG. Herein e indicates elementary charge, $n_s$ indicates the concentration of the 2 DEG at an interface of the electron transit layer 15a with the electron supply layer 15b, $d_0$ indicates the thickness of the electron transit layer 15a, $d_1$ indicates a distance between an upper surface of the electric-field relaxation layer 14 and an upper surface of the electric-field control layer 13, $\in$ indicates dielectric constant for the electron transit layer 15a and the electric-field relaxation layer 14, V indicates an external voltage (applied voltage), and $V_1$ indicates a potential of the electric-field control layer 13.

$$en_s \geq \frac{\varepsilon}{(d_0 + d_1)}(V - V_1)$$

The above formula is modified to a formula (1). Herein $d_2$ indicates a thickness of the electric-field control layer 13 and $d_3$ indicates a thickness of the buffer layer.

$$\frac{d_0 + d_1}{d_1 + d_2 + d_3} \geq \frac{\varepsilon}{en_s(d_1 + d_2 + d_3)}(V - V_1) \qquad (1)$$

For example, if it is that V=600V, $d_1$=2.4 µm, $d_2$+$d_3$=2.2 µm, e=$1.6 \times 10^{19}$ C, and $\in$=$9 \times 8.85 \times 10^{-14}$ F/cm, the right-hand side of a formula (2), which will be explained later, is 0.44 (in a case where $n_s$ is $1.0 \times 10^{13}$ cm$^{-2}$) or 0.55 (in a case where $n_s$ is $0.8 \times 10^{13}$ cm$^{-2}$).

Herein the equivalent circuit C1 shown in FIG. 2B is considered. The resistance R1 is a resistance in the thickness direction of the electric-field relaxation layer 14 below the cathode electrode C. The resistance R2 is a resistance in the thickness direction of the electric-field relaxation layer 14 below the anode electrode A. The resistance R3 is the sum of the resistance in the thickness direction of the buffer layer 12 and the resistance in the thickness direction of the electric-field control layer 13.

If a voltage share of the equivalent circuit C1 is calculated, a following formula holds true where $R_1$, $R_2$, and $R_3$ are resistance values for the resistances R1, R2, and R3.

$$V_1 = \frac{R_2 R_3}{R_1 R_2 + R_2 R_3 + R_3 R_1} V$$

It is supposed that the resistances R1, R2, and R3 are of the same material system and resistivity ρ are uniform. When considering resistances $R_1$, $R_2$, and $R_3$ per unit area, a formula below holds true.

$$R_1 = \rho d_1, R_2 = \rho d_2, R_3 = \rho(d_2 + d_3)$$

A following formula is derived from the above-described two formulae. $V_1$ in this state is determined by the thicknesses of the buffer layer 12, the electric-field control layer 13, and the electric-field relaxation layer 14.

$$V_1 = \frac{d_2 + d_3}{d_1 + 2(d_2 + d_3)} V$$

A formula (2) is obtained by substituting the right-hand side of the formula (1) with the above-described formula.

$$\frac{\varepsilon}{en_s(d_1 + d_2 + d_3)} \cdot (V - V_1) = \frac{\varepsilon}{en_s(d_1 + d_2 + d_3)} \cdot \left(V - \frac{d_2 + d_3}{d_1 + 2(d_2 + d_3)} V\right) \qquad (2)$$

-continued $$= \frac{\varepsilon}{en_s(d_1 + d_2 + d_3)}.$$

$$\frac{d_1 + d_2 + d_3}{d_1 + 2(d_2 + d_3)}V$$

$$= \frac{\varepsilon}{en_s} \cdot \frac{1}{d_1 + 2(d_2 + d_3)}V,$$

$$\therefore \frac{d_0 + d_1}{d_1 + d_2 + d_3} \geq \frac{\varepsilon}{en_s} \cdot$$

$$\frac{1}{d_1 + 2(d_2 + d_3)}V$$

That is, the formula (2) holds true in a case where $V_1$ is determined by the thicknesses of the buffer layer 12, the electric-field control layer 13, and the electric-field relaxation layer 14.

On the other hand, in a case where $V_1$ is determined by a midpoint potential, the formula (1) becomes a formula (3) below.

$$\frac{d_0 + d_1}{d_1 + d_2 + d_3} \geq \frac{\varepsilon}{en_s(d_1 + d_2 + d_3)} \cdot \frac{V}{2} \quad (3)$$

If the 2 DEG is made not depleted completely, since the depletion layer does not reach the end of the cathode electrode (or the end of the drain electrode), a formula below holds true.

$$L_{ac} \geq \sqrt{\frac{\varepsilon V}{eN_s}}$$

An on-resistance value of the semiconductor element is indicated by a formula below.

$$\frac{L_{ac}}{W}r_{sheet}$$

Therefore, a formula below is derived from the condition that the on-resistance of the semiconductor element is equal to or smaller than a specification value of an on-resistance required for the semiconductor element.

$$R_{on} \geq \frac{L_{ac}}{W}r_{sheet}, \therefore \frac{R_{on}}{r_{sheet}}W \geq L_{ac}$$

Moreover, a formula (4) is derived from the above-described formula.

$$\frac{R_{on}}{r_{sheet}}W \geq L_{ac} \geq \sqrt{\frac{\varepsilon V}{eN_s}} \quad (4)$$

Herein $R_{on}[\Omega]$ indicates a specification value for an on-resistance required for the semiconductor element, $r_{sheet}$ [$\Omega \cdot \square$] indicates an average value for a sheet resistance between the electrodes, $N_s[cm^{-3}]$ indicates a carrier density converted from the concentration of the 2 DEG, indicating the number of electrons per a unit area, to the number of carriers per a unit volume, $L_{ac}$ indicates an inter-electrode distance, and W indicates a width of an electric path between the electrodes.

Figure 13:
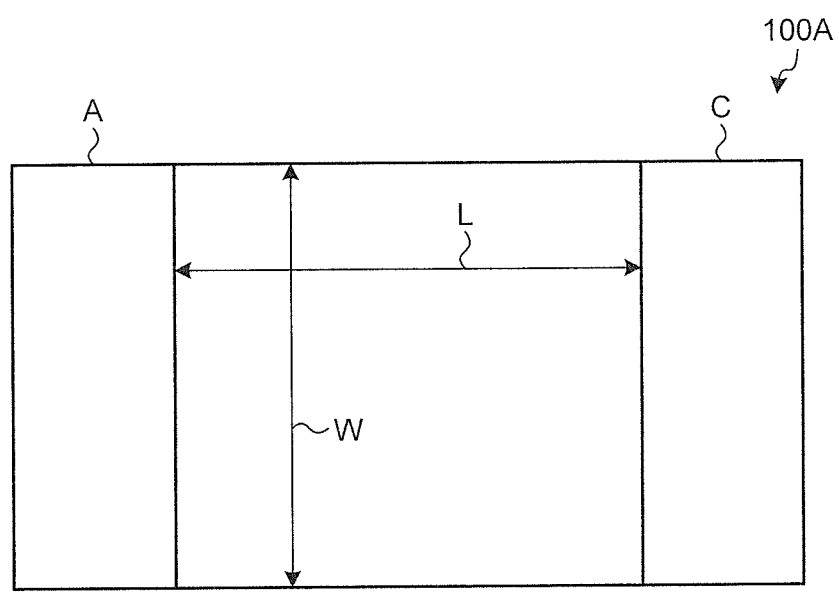
FIG. 13 is a view for explaining a width of an electric current path.

FIG. 13 is a view for explaining a width of an electric path by using a plan view of the semiconductor element 100A shown in FIG. 1. L indicates an inter-electrode distance and corresponds to $L_{ac}$ of the formula (4). As shown in FIG. 13, the width of electric path means the width of the electric path when an electric current flows between subject electrodes (herein the anode electrode A and the cathode electrode C). In a case where the semiconductor element is a field effect transistor, the subject electrodes are the gate electrode and the drain electrode.

In the above-described embodiments, the buffer layer may have a multi-layer structure in which each of $Al_uGa_{1-u}N$ (0≤u<1) layers of which thicknesses is 0.1 μm to 0.8 μm and each of $Al_zGa_{1-v}N$ (0<v≤1 and u<v) layers of which thicknesses is 20 nm to 60 nm are layered several times alternately and repeatedly. The electric-field control layer may have a multi-layer structure of a first layer made of $AlxGa_{1-x}N$ (0≤x<1) and a second layer made of $Al_yGa_{1-y}N$ (0<y≤1) having a band-gap wider than that of the first layer. The electric-field relaxation layer may be of a structure in which the second electric-field relaxation layer is configured by a single layer made of a single composition, the first electric-field relaxation layer is configured by a multi-layer structure of a first portion of which composition is the same as that of the second electric-field relaxation layer and a second portion of which composition is different from that of the second electric-field relaxation layer in an order closer to the substrate, and the second portion has a thickness so that a resistance in the substrate's lateral direction at a portion where the first portion is connected to the second portion is larger than 1/10 of the resistance of the second electric-field relaxation layer. For example, the first electric-field relaxation layer may have a multi-layer structure in which each of $Al_zGa_{1-z}N$ (0≤z<1) layers of which thickness is 5 nm to 20 nm and each of $Al_wGa_{1-w}N$ (0<w≤1 and z<w) layers of which thickness is 5 nm to 20 nm are layered several times alternately and repeatedly. The electron supply layer of the active layer is not limited to a specific composition as long as which has a band-gap wider than that of the electron transit layer.

Although the substrate is made of Si in the above-described embodiments, the material for the substrate is not limited specifically and may be made of a different kind of substrate such as sapphire, silicon carbide (SiC), or zinc oxide (ZnO). Materials configuring each layer of the nitride semiconductor layer are not limited to those of the above-described embodiments and may be selected appropriately from nitride semiconductors indicated as $Al_xIn_yGa_{1-x-y}As_uP_vN_{1-u-v}$ (where 0≤x≤1, 0≤y≤1, x+y≤1, 0≤u≤1, 0≤v≤1, and u+v<1).

The present invention is not limited by the above-described embodiments. The present invention includes a configuration of combining each of the above-described elements appropriately. In addition, further effects or modification examples can be derived by an ordinary skilled person in the art easily. Therefore, further wide aspects of the present invention are not limited by the above-described embodiments and can be modified variously.

INDUSTRIAL APPLICABILITY

As described above, the semiconductor multi-layer substrate and the semiconductor element according to the present invention are suitable for use in, for example, a power semiconductor element.

REFERENCE SIGNS LIST 10, 20, 30 semiconductor multi-layer substrate
11 substrate
12 buffer layer
12a, 12d, 12f, 12h, 13b, 34b AlN layer
12b, 24aa, 24ab, 24ac AlGaN layer
12c, 12e, 12g, 13a, 34a, 34c C—GaN layer
13 electric-field control layer
14, 24, 34 electric-field relaxation layer
14a, 24a first electric-field relaxation layer
14b, 24b second electric-field relaxation layer
15 active layer
15a electron transit layer
15b electron supply layer
100A, 100B, 100C, 200A, 200B, 200C, 300A, 300B, 300C semiconductor element
A anode electrode
C cathode electrode
D drain electrode
G gate electrode
I gate insulating film
L1, L2 line
S source electrode

The invention claimed is:

1. A semiconductor multi-layer substrate comprising:
a substrate;
a buffer layer formed on the substrate and made of a nitride semiconductor;
an electric-field control layer formed on the buffer layer and made of a nitride semiconductor, the electric-field control layer having conductivity in the substrate's lateral direction;
an electric-field relaxation layer formed on the electric-field control layer and made of a nitride semiconductor; and
an active layer formed on the electric-field relaxation layer and made of an nitride semiconductor,
wherein a resistance in the substrate's lateral direction of the electric-field control layer is equal to or smaller than 10 times a resistance of the electric-field relaxation layer,
a ratio of an electric field share between the electric-field relaxation layer and the buffer layer is controlled by a ratio between a thickness of the electric-field relaxation layer and a thickness of the buffer layer, and
a ratio of a distance between an upper surface of the electric-field relaxation layer and an upper surface of the electric-field control layer relative to a sum of the thicknesses of the buffer layer, the electric-field control layer, and the electric-field relaxation layer is within a range of 0.3 to 0.8.

2. The semiconductor multi-layer substrate according to claim 1, wherein the ratio of the distance between the upper surface of the electric-field relaxation layer and the upper surface of the electric-field control layer relative to the sum of the thicknesses of the buffer layer, the electric-field control layer, and the electric-field relaxation layer is within a range of 0.3 to 0.7.

3. The semiconductor multi-layer substrate according to claim 1, wherein the ratio of the distance between the upper surface of the electric-field relaxation layer and the upper surface of the electric-field control layer relative to the sum of the thicknesses of the buffer layer, the electric-field control layer, and the electric-field relaxation layer is within a range of 0.4 to 0.7.

4. The semiconductor multi-layer substrate according to claim 1, wherein a relationship of $0.3 \leq a/(a+b) \leq 0.7$ holds true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

5. The semiconductor multi-layer substrate according to claim 1, wherein a relationship of $0.4 \leq a/(a+b) \leq 0.7$ holds true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

6. The semiconductor multi-layer substrate according to claim 1, wherein a relationship of $0.3 \leq c/(c+d) \leq 0.8$ holds true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ cm$^{-3}$ to $1 \times 10^{20}$ cm$^{-3}$.

7. The semiconductor multi-layer substrate according to claim 1, wherein a relationship of $0.3 \leq c/(c+d) \leq 0.7$ holds true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ Cm$^{-3}$ to $1 \times 10^{20}$ cm$^{-3}$.

8. The semiconductor multi-layer substrate according to claim 1, wherein a relationship of $0.4 \leq c/(c+d) \leq 0.7$ holds true where c is a thickness of an area, including the active layer and the electric-field relaxation layer, of which carbon density is $1 \times 10^{18}$ cm$^{-3}$ to $1 \times 10^{20}$ cm$^{-3}$, and d is a thickness of an area, including the electric-field control layer and the buffer layer, of which carbon density is $1 \times 10^{18}$ cm$^{-3}$ to $1 \times 10^{20}$ cm$^{-3}$.

9. The semiconductor multi-layer substrate according to claim 1, wherein the electric-field control layer has an area of which resistance is reduced by doping an impurity.

10. The semiconductor multi-layer substrate according to claim 1, wherein the buffer layer has a structure in which each of $Al_uGa_{1-u}N$ ($0 \leq u < 1$) layers of which thickness is 0.1 μm to 0.8 μm and each of $AlvGa_{1-v}N$ ($0 < v \leq 1$ and $u < v$) layers of which thickness is 20 nm to 60 nm are layered several times alternately and repeatedly.

11. The semiconductor multi-layer substrate according to claim 1, wherein the active layer has a multi-layer structure of an electron transit layer and
an electron supply layer being formed on the electron transit layer and having a band-gap wider than a band-gap of the electron transit layer.

12. A semiconductor element comprising two or more electrodes formed on the active layer of the semiconductor multi-layer substrate according to claim 1.

13. The semiconductor element according to claim 12, wherein the electrodes include a Schottky electrode being formed on the active layer and being subjected to Schottky contact with the active layer and an ohmic electrode formed on the active layer and being subjected to ohmic contact with the active layer.

14. The semiconductor element according to claim 12, wherein the electrodes include two ohmic electrodes being formed on the active layer and being subjected to ohmic contact with the active layer and a Schottky electrode being formed on the active layer, being disposed between the two ohmic electrodes, and being subjected to Schottky contact with the active layer.

15. The semiconductor element according to claim 12, wherein the electrodes include two ohmic electrodes being formed on the active layer and being subjected to ohmic contact with the active layer, an insulation film formed on the active layer and disposed between the two ohmic electrodes, and an electrode formed on the insulation film.

16. The semiconductor element according to claim 12, wherein a formula (4) below holds true:

$$\frac{R_{on}}{r_{sheet}} W \geq L_{ac} \geq \sqrt{\frac{\varepsilon V}{eN_s}} \quad (4)$$

where $R_{on}[\Omega]$ is a specification value for an on-resistance required for the semiconductor element, $r_{sheet}$ [Ω·□] is an average value for a sheet resistance between the electrodes, $N_s[cm^{-3}]$ is an average value for carrier density between the electrodes, $L_{ac}$ is an inter-electrode distance between the electrodes, and W is width of a path of an electric current between the electrodes.

17. The semiconductor element according to claim 12, wherein the active layer has a multi-layer structure of an electron transit layer and an electron supply layer being formed on the electron transit layer and having a band-gap wider than a band-gap of the electron transit layer, and a formula (1) below holds true:

$$\frac{d_0 + d_1}{d_1 + d_2 + d_3} \geq \frac{\varepsilon}{en_s(d_1 + d_2 + d_3)}(V - V_1) \quad (1)$$

where e is elementary charge, $n_s$ is a concentration of two-dimensional electron gas at an interface between the electron transit layer and the electron supply layer, $d_0$ is a thickness of the electron transit layer, $d_1$ is distance between an upper surface of the electric-field relaxation layer and an upper surface of the electric-field control layer, $d_2$ is a thickness of the electric-field control layer, $d_3$ is a thickness of the buffer layer, c indicates dielectric constant of the electron transit layer and the electric-field relaxation layer, V is a voltage applied to the electrode, and $V_1$ is potential of the electric-field control layer.

18. The semiconductor element according to claim 17, wherein a formula (2) below holds true $$\frac{d_0 + d_1}{d_1 + d_2 + d_3} \leq \frac{\varepsilon}{en_s} \cdot \frac{1}{d_1 + 2(d_2 + d_3)} V. \quad (2)$$

19. The semiconductor element according to claim 17, wherein a formula (3) below holds true $$\frac{d_0 + d_1}{d_1 + d_2 + d_3} \geq \frac{\varepsilon}{en_s(d_1 + d_2 + d_3)} \cdot \frac{V}{2}. \quad (3)$$

20. The semiconductor multi-layer substrate according to claim 1, wherein the electric-field relaxation layer includes a first field-relaxing layer and a second field-relaxing layer being formed on the first field-relaxing layer and having a layer structure different from a layer structure of the first field-relaxing layer.

21. The semiconductor multi-layer substrate according to claim 20, wherein in the electric-field relaxation layer, the second electric-field relaxation layer is configured by a single layer made of a single composition, and the first electric-field relaxation layer is configured by a multi-layer structure of a first portion of which composition is the same as a composition of the second electric-field relaxation layer and a second portion of which composition is different from the composition of the second electric-field relaxation layer in an order from a side closer to the substrate, and the second portion has a thickness so that a resistance in the substrate's lateral direction at a portion where the first portion is connected to the second portion is larger than 1/10 of the resistance of the second electric-field relaxation layer.

22. The semiconductor multi-layer substrate according to claim 20, wherein in the electric-field relaxation layer, the second electric-field relaxation layer is configured by a single layer made of a single composition, and the first electric-field relaxation layer has a structure in which each of $Al_zGa_{1-z}N$ (0≤z<1) layers of which thickness is 5 nm to 20 nm and each of $Al_wGa_{1-w}N$ (0<w≤1 and z<w) layers of which thickness is 5 nm to 20 nm are layered several times alternately and repeatedly.

23. The semiconductor multi-layer substrate according to claim 20, wherein the first field-relaxing layer of the electric-field relaxation layer is configured by AlGaN having a composition in which a band-gap decreases from the substrate side toward the active layer side.

24. The semiconductor multi-layer substrate according to claim 23, wherein in the electric-field relaxation layer, the first field-relaxing layer is made of a plurality of AlGaN layers having different compositions in which band-gaps are narrowed from the substrate side toward the active layer side.

25. A semiconductor multi-layer substrate according to claim 1, comprising:
a substrate;
a buffer layer formed on the substrate and made of a nitride semiconductor;
an electric-field control layer formed on the buffer layer and made of a nitride semiconductor, the electric-field control layer having conductivity in the substrate's lateral direction;
an electric-field relaxation layer formed on the electric-field control layer and made of a nitride semiconductor; and
an active layer formed on the electric-field relaxation layer and made of an nitride semiconductor,
wherein a resistance in the substrate's lateral direction of the electric-field control layer is equal to or smaller than 10 times a resistance of the electric-field relaxation layer,
a ratio of an electric field share between the electric-field relaxation layer and the buffer layer is controlled by a ratio between a thickness of the electric-field relaxation layer and a thickness of the buffer layer, and a relationship of $0.3 \leq a/(a+b) \leq 0.8$ holds true where a withstand voltage is equal to or greater than Vb, a leakage current when the voltage Vb is applied is equal to or smaller than IL, dt is a sum of a thickness of the active layer, the thickness of the electric-field relaxation layer, a thickness of the electric-field control layer, and the thickness of the buffer layer, a is a thickness of an area, including the active layer and the electric-field relaxation layer, of which resistance per thickness is greater than a value indicated as $Vb/(IL \cdot dt)$, and b is a thickness of an area, including the electric-field control layer and the buffer layer, of which resistance per thickness is greater than a value indicated as $Vb/(IL \cdot dt)$.

26. A semiconductor multi-layer substrate, comprising:

a substrate;

a buffer layer formed on the substrate and made of a nitride semiconductor;

an electric-field control layer formed on the buffer layer and made of a nitride semiconductor, the electric-field control layer having conductivity in the substrate's lateral direction, an electric-field relaxation layer formed on the electric-field control layer and made of a nitride semiconductor; and an active layer formed on the electric-field relaxation layer and made of an nitride semiconductor, wherein a resistance in the substrate's lateral direction of the electric-field control layer is equal to or smaller than 10 times a resistance of the electric-field relaxation layer, a ratio of an electric field share between the electric-field relaxation layer and the buffer layer is controlled by a ratio between a thickness of the electric-field relaxation layer and a thickness of the buffer layer, and the electric-field control layer has a multi-layer structure including a first layer made of $Al_xGa_{1-x}N$ ($0 \leq x < 1$) and a second layer having a band-gap wider than a band-gap of the first layer and being made of $Al_yGa_{1-y}N$ ($0 < y \leq 1$).

* * * * *